United States Patent
Cairoli et al.

(10) Patent No.: US 10,554,201 B2
(45) Date of Patent: Feb. 4, 2020

(54) SOLID STATE SWITCH SYSTEM

(71) Applicant: ABB Schweiz AG, Baden (CH)

(72) Inventors: Pietro Cairoli, Raleigh, NC (US);
Lukas Hofstetter, Basel (CH);
Matthias Bator, Baden-Wurtternberg (DE); Ricardo Bini, Baden (CH);
Munaf Rahimo, Uezwil (CH)

(73) Assignee: ABB Schweiz AG, Baden (CH)

( * ) Notice: Subject to any disclaimer, the term of this patent is extended or adjusted under 35 U.S.C. 154(b) by 253 days.

(21) Appl. No.: 15/495,091

(22) Filed: Apr. 24, 2017

(65) Prior Publication Data

US 2018/0026623 A1 Jan. 25, 2018

Related U.S. Application Data

(60) Provisional application No. 62/365,767, filed on Jul. 22, 2016.

(51) Int. Cl.
*H03K 17/082* (2006.01)
*H03K 5/15* (2006.01)
(Continued)

(52) U.S. Cl.
CPC ..... *H03K 17/0822* (2013.01); *H03K 5/15006* (2013.01); *H03K 17/0824* (2013.01); *H03K 17/133* (2013.01); *H03K 17/136* (2013.01); *H03K 17/567* (2013.01); *H03K 17/6872* (2013.01); *H02H 3/05* (2013.01); *H03K 17/102* (2013.01); *H03K 17/105* (2013.01);
(Continued)

(58) Field of Classification Search
USPC .................................................. 361/2–13
See application file for complete search history.

(56) References Cited

U.S. PATENT DOCUMENTS

| 4,598,330 A | 7/1986 | Woodworth |
| 4,736,268 A * | 4/1988 | Wagoner .............. H03K 17/16 361/111 |

(Continued)

FOREIGN PATENT DOCUMENTS

| EP | 0197658 C1 | 3/1966 |
| EP | 0118007 B1 | 1/1984 |

(Continued)

OTHER PUBLICATIONS

Shen, et al., Wide-Bandgap Solid State Circuit Breakers for DC Power Systems: Device and Circuit Considerations, IEEE Transactions on Electron Devices, vol. 62, No. 2, Feb. 2015.

(Continued)

*Primary Examiner* — Danny Nguyen
(74) *Attorney, Agent, or Firm* — Taft Stettinius & Hollister LLP; J. Bruce Schelkopf

(57) ABSTRACT

A solid state switch for connecting and disconnecting an electrical device has at least one FET-type device and at least one thyristor-type device coupled in parallel to the at least one FET-type device. A gate driver is operative to send gate drive signals to the at least one FET-type device and to the at least one thyristor-type device for providing current to the electrical device. The gate driver is constructed to control a split of the current as between the at least one FET-type device and the at least one thyristor-type device.

35 Claims, 19 Drawing Sheets

(51) Int. Cl.
*H03K 17/13* (2006.01)
*H03K 17/687* (2006.01)
*H03K 17/567* (2006.01)
*H03K 5/00* (2006.01)
*H03K 17/10* (2006.01)
*H03K 17/12* (2006.01)
*H02H 3/05* (2006.01)

(52) U.S. Cl.
CPC . *H03K 17/125* (2013.01); *H03K 2005/00078* (2013.01); *H03K 2017/6875* (2013.01); *H03K 2217/0036* (2013.01)

(56) References Cited

U.S. PATENT DOCUMENTS

| | | |
|---|---|---|
| 5,155,289 A | 10/1992 | Bowles |
| 5,293,051 A | 3/1994 | Mariyama et al. |
| 7,023,681 B2 | 4/2006 | Kitahara et al. |
| 8,344,545 B2 | 1/2013 | Fuller et al. |
| 8,422,182 B2 | 4/2013 | Boudet et al. |
| 8,766,481 B2 | 7/2014 | Divan |
| 2008/0024074 A1 | 1/2008 | Mosebrook et al. |
| 2010/0277006 A1 | 11/2010 | Urciuoli |
| 2011/0121744 A1 | 5/2011 | Salvestrini et al. |
| 2011/0134675 A1 | 6/2011 | Grbovic |
| 2011/0222316 A1 | 9/2011 | Kato |
| 2012/0033471 A1 | 2/2012 | Newman, Jr. |
| 2013/0062626 A1 | 3/2013 | Takao et al. |
| 2014/0009189 A1 | 1/2014 | Mauder et al. |
| 2014/0097680 A1 | 4/2014 | Navarro |
| 2014/0185346 A1 | 7/2014 | Liu et al. |
| 2017/0141558 A1* | 5/2017 | Waldron ................ H02H 3/027 |
| 2017/0141560 A1* | 5/2017 | Waldron ............... H03K 17/567 |

FOREIGN PATENT DOCUMENTS

| | | |
|---|---|---|
| EP | 0272898 A2 | 12/1987 |
| EP | 0622902 B1 | 9/1993 |
| EP | 0674390 A1 | 3/1995 |
| EP | 0910169 A2 | 10/1998 |
| EP | 1225687 A1 | 7/2002 |
| GB | 2294166 A | 10/1996 |

OTHER PUBLICATIONS

Urciuoli, et al., Demonstration of a 600-V, 60-A, Bidirectional Silicon Carbide Solid-State Circuit Breaker, APEC 2011.

International Search Report and Written Opinion issued in corresponding international application No. PCT/US2017/043523, dated Dec. 20, 2017, 17 pp.

International Preliminary Report on Patentability issued in corresponding international application No. PCT/US2017/043523, dated Jan. 22, 2019, 13 pp.

\* cited by examiner

SOLID STATE SWITCH SYSTEM

TECHNICAL FIELD

The present application generally relates to switches and more particularly, but not exclusively, to a solid state switch system.

BACKGROUND

Solid state switch systems of various types, e.g., contactors, circuit breakers, relays and other solid state switches remain an area of interest. Some existing systems have various shortcomings, drawbacks and disadvantages relative to certain applications. For example, in some solid state switch systems, improvements in power loss, e.g., during steady state operation of electrical devices and/or during inrush or other surge currents drawn by the electrical devices may be made. Accordingly, there remains a need for further contributions in this area of technology.

SUMMARY

One embodiment of the present invention is a solid state switch system. Other embodiments include apparatuses, systems, devices, hardware, methods, and combinations for solid state switch systems. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
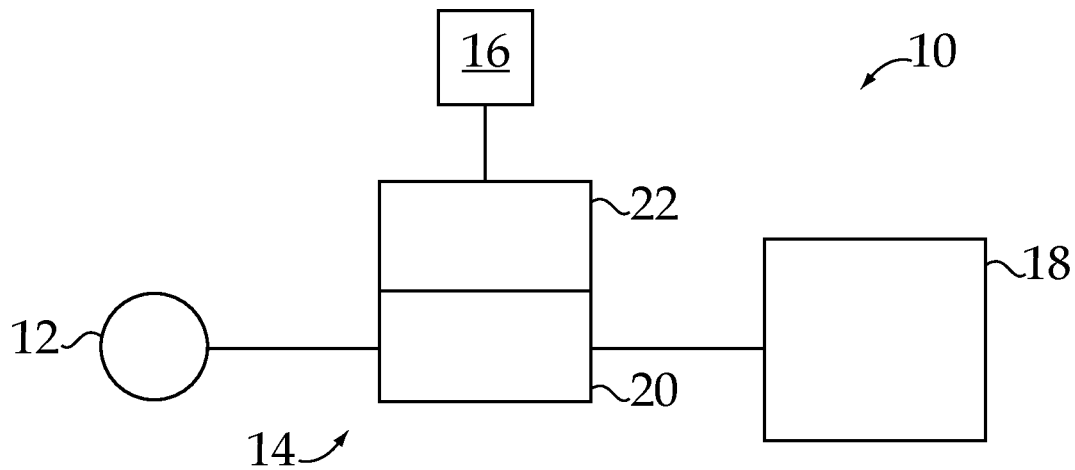
FIG. 1 schematically illustrates some aspects of a non-limiting example of an electrical system in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring to FIG. 1, some aspects of a non-limiting example of an electrical system 10 in accordance with an embodiment of the present invention are schematically illustrated. Electrical system 10 includes a power source 12, a solid state switch system 14 coupled to power source 12, a command input 16 communicatively coupled to solid state switch system 14, and an electrical device 18 coupled to solid state switch system 14. Power source 12 is an AC power source, such as a utility grid or a facility grid or generator system, or any other AC power source. Solid state switch system 14 is a switch that is operative to connect electrical device 18 to and disconnect electrical device 18 from power source 12. Electrical device 18 may take any one or more of a variety of forms. For example, in one form, electrical device 18 is an electrical machine with a power rating of 1 kW-5 kW, such as an induction motor or any other type of electric motor. In other embodiments, electrical device 18 may be a motor rated at less than 1 kW or may be rated at greater than 5 kW. In still other embodiments, electrical device 18 may be any type of machine, system or device that is power by electricity. In some embodiments, solid state switch system 14 may be or be a portion of a circuit breaker system, and electrical device 18 may be an electric circuit for supplying power to any number of electrically powered apparatuses that are electrically coupled thereto, for example and without limitation, one or more motors, appliances, HVAC systems, tool systems including machine tools, hand tools and other electrically powered tools, computer systems, lighting systems, conveyor systems, chemical or other processing systems, office systems, building and/or facility systems, and/or any other types of electrically powered contrivances powered by an AC voltage/current at 50 Hz, 60 Hz or any other suitable frequency. The electric circuit may be of a municipal, industrial, home or other nature. In other embodiments, solid state switch system 14 may be a solid state relay, contactor or any other type of on/off switch system. Electrical device 18 has a rated current, and has associated therewith a surge current, e.g., electrical device 18 may draw a surge current in certain operating conditions, e.g., during startup of all or a part of electrical device 18 or during a state change, e.g., an operating state change, of all or a part of electrical device 18.

Solid state switch system 14 includes a solid state switch 20 having solid state switching elements, and a gate driver 22. Solid state switch 20 may be disposed, for example, in a case or housing or cabinet or other protective structure (not shown). In one form, solid state switch 20 is a solid state contactor. In other embodiments, solid state switch 20 may be a relay, a circuit breaker or circuit breaker switch, or any other type of switch for industrial, home, office, workshop, municipal or any other purpose. Embodiments of solid state switch system 14 may be employed in single phase systems, two-phase systems and three-phases systems, as well as other multi-phase systems. Gate driver 22 is operative to provide gate drive signals to control the solid state switching elements of solid state switch 20 to permit or prevent the flow of current through switch 20. In some embodiments, solid state switch 20 may include a galvanic isolator. In some embodiments, switch 14, e.g., gate driver 22 or another controller or system may include a fault detection circuit and a protection circuit, e.g., a circuit breaker protection circuit operative to direct gate driver 22 to disconnect electrical device 18 from power source 12, e.g., in response to a detected short circuit condition, ground fault condition, or other safety or other fault detection. In one form, for three-phase electrical systems 10, a separate switch 20 and gate driver 22 is used for each a, b and c phases. In some three-phase embodiments, a common gate driver 22 may be constructed to provide gate drive signals to each solid state switch 20.

Command input 16 is communicatively coupled to gate driver 22. Command input 16 is operative to provide an on/off control signal to direct gate driver 22 to turn solid state switch 20 on or off, i.e., to connect electrical device 18 to power source 12 or disconnect electrical device 18 from power source 12. In one form, command input 16 is a human-operated switch. In other embodiments, command input 16 may also include or alternatively be in of itself or be the output of a computer, a programmable logic circuit, a circuit breaker controller or protection control circuit, or any other electrical or electronic device operative to send an on/off signal to gate driver 22, e.g., a digital on/off signal, for turning solid state switch 20 on and off.

In considering solid state switch design, thyristor technology may be employed to make a solid state switch, e.g., a solid state contactor, and may have much higher power density than electromechanical switches. However, in many installations, any such thyristor switches or contactors might require spacing between two or more devices on the same DIN (Deutsches Institut für Normung) or other rail (e.g., up to 22 mm) in order to fully utilize thyristor current ratings. The extra spacing is necessary due to the thyristor cooling requirements, e.g., spacing required for necessary or desirable heat sinks, cooling pins/fins or other cooling structures/devices to draw heat from such thyristor devices. Any such thyristor switches used alone might be spaced more closely, but closer spacing may require the thyristor switches to be required to be de-rated, which in some cases means that additional switches may be required, thus adding to the space requirements for the switches and increasing cost. This is particularly true for switching motor loads beyond 4 kW and resistive loads at higher current levels, e.g., above 5-7 A. The conduction power loss of thyristor technology thus forces a move to bigger cases and different form factors from conventional electromechanical switches/contactors with the same ratings.

Figure 2:
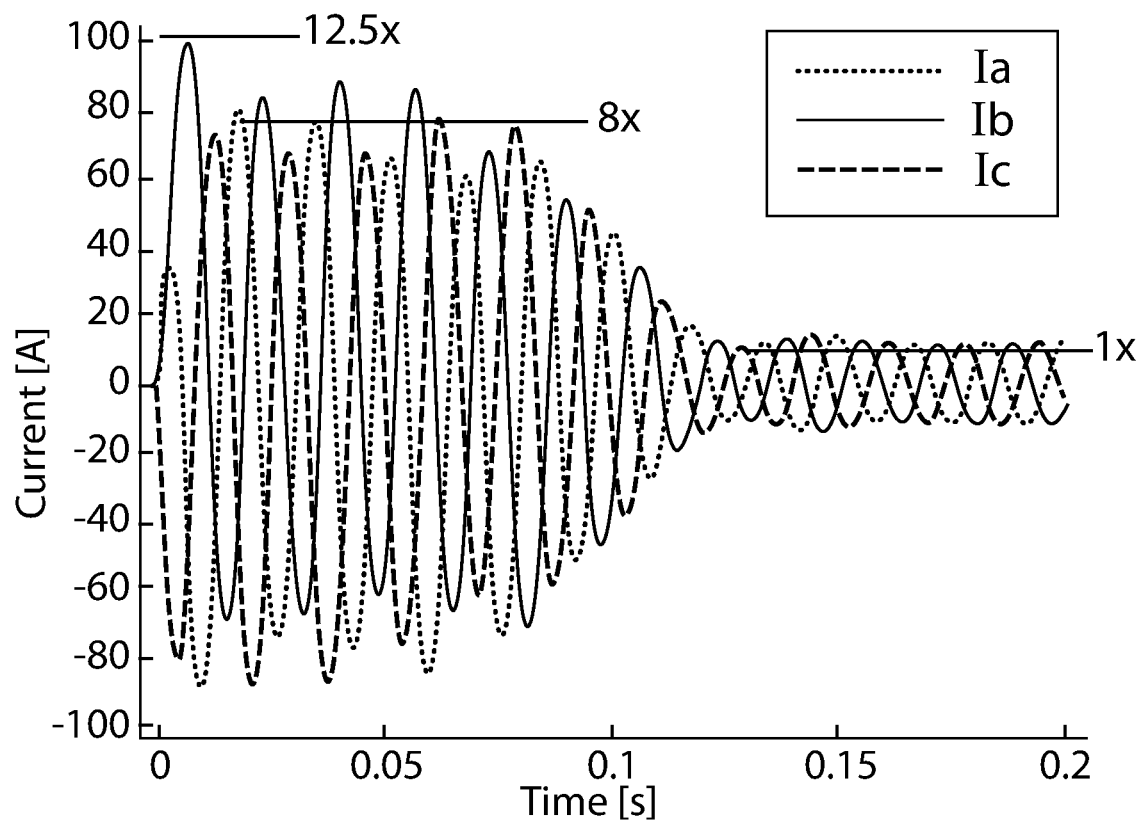
FIG. 2 illustrates some aspects of a non-limiting example of a surge current or overcurrent during startup of an electrical machine that may be accommodated in accordance with an embodiment of the present invention.

Considerations also include that many electrical devices such as electrical device 18 may draw surge currents in some situations, thus requiring additional heat dissipation. Surge currents include, for example and without limitation, inrush currents generally, magnetizing inrush currents, rotor lock or motor start currents, and other forms of surge currents. For example, motor loads involve conduction losses related to both currents in the nominal range and overcurrents due to inrush, e.g., magnetizing inrush, and startup of the motor. FIG. 2 illustrates a non-limiting example of a current profile of the startup of a 3-phase induction motor, where the peak inrush current reaches 12.5× the nominal current or rated current and the motor start current reaches 8× the nominal current. Nominal current is the current flow at approximately the rated current of electrical device 18 or less. It should be noted that high efficiency motors are characterized with peak inrush currents up to 18-20× the nominal current. Other types of electrical devices also experience inrush currents, e.g., incandescent lighting, fluorescent lighting, compact fluorescent lighting, LED lighting, just to name a few. Some electrical devices may experience inrush currents in excess of and sometimes substantially in excess of 18-20× the nominal current. It is desirable that solid state switches, e.g., contactors, relays or other switch types, be configured to manage, and preferably optimize, power loss/heat generation profiles in view of both current flow scenarios, i.e., nominal current flow and surge current flow or overcurrents, which may in some embodiments reduce overall power loss, and/or reduce spacing requirements as between the switch elements and/or switches, e.g., on the rail.

Field Effect Transistor-type devices (FET-type devices), for example and without limitation, JFETs and MOSFETs, are power semiconductor devices with a different conduction power loss profile relative to thyristors. The voltage-current characteristic of FETs is mostly resistive and yields lower conduction losses in lower current regimes, in comparison to thyristor-type devices, which have voltage-current characteristics that are mostly comparable to a fixed voltage related to the p-n junction voltage which is typical of these types of devices. The fixed voltage characteristic generates relatively high losses compared to FET-type devices in lower current regimes, but generates relatively moderate losses as compared to FET-type devices in higher current regimes.

In accordance with embodiments of the present invention, a combination of FET-type devices and thyristor-type devices is employed in parallel as switching elements. The FET-type devices and the thyristor-type devices are each selected and constructed or sized to minimize power losses at both lower current regimes and higher current regimes, thus providing an improved loss profile. For example, in once form, switch 20 includes a terminal T1 constructed for coupling switch 20 to power source 12 for receiving power from power source 12; a terminal L1 constructed for providing power from power source 12 to electrical device 18; at least one FET-type device 24 coupled to terminal T1 and terminal L1; and at least one thyristor-type device 26 coupled to the terminal T1 and terminal L1 in parallel to the at least one FET-type device 24. In one form, the switching elements, i.e., the at least one FET-type device 24 and the at least one thyristor-type device 26 are coupled directly to respective terminals T1 and L1, i.e., without any intervening components, e.g., such as capacitors, resistors, inductors or other devices. In other embodiments, intervening components may be utilized.

The at least one FET-type device 24 is constructed with a first power loss characteristic based on the rated current; and the at least one thyristor-type device 26 is constructed with a second power loss characteristic based on a surge current, for example and without limitation, an inrush current and a start current associated with electrical device 18. Gate driver 22 is communicatively coupled to the gates of each of the at least one FET-type device 24 and the at least one thyristor-type device 26, and is operative to provide gate drive signals to switching element, e.g., the gates of each device, for turning each device on or off. In some embodiments, one or more gate drivers 22 may be shared by both the at least one FET-type device 24 and the at least one thyristor-type device 26. In other embodiments, each of the at least one FET-type device 24 and the at least one thyristor-type device 26 may have one or more dedicated gate drivers 22.

Figure 4:
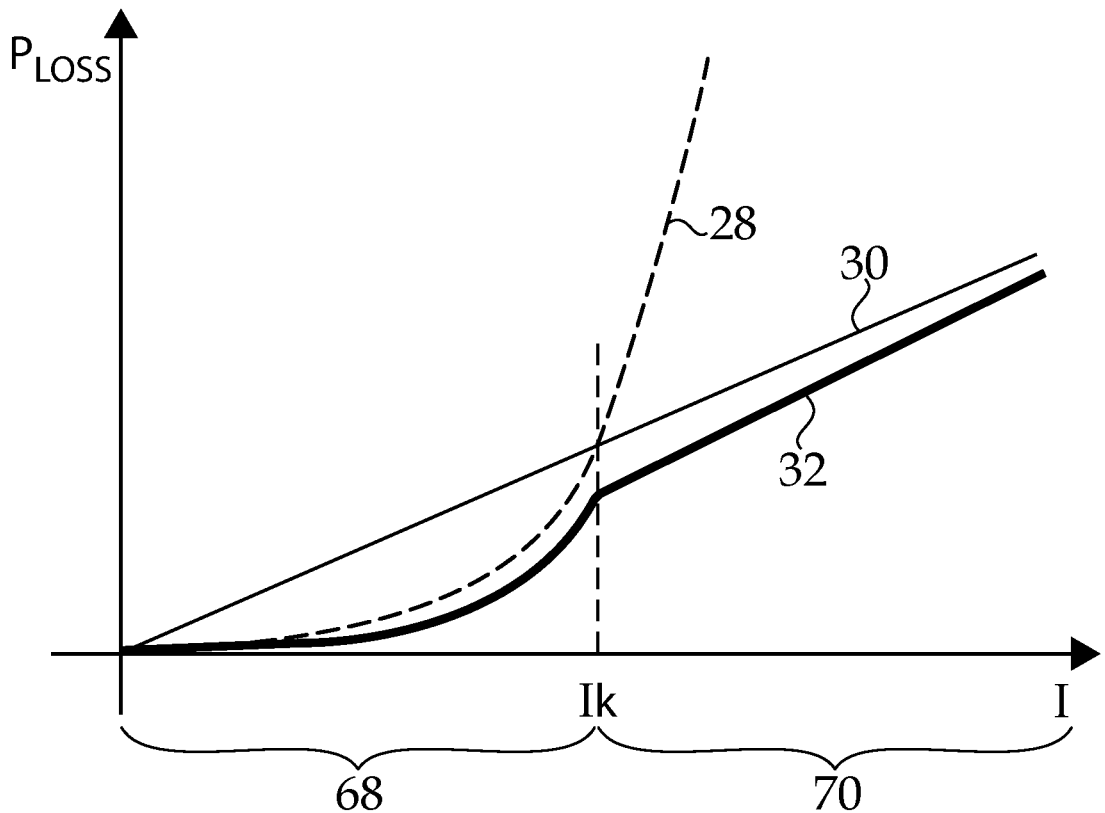
FIG. 4 illustrates some aspects of a non-limiting example of a loss profile of a FET-type device, a thyristor-type device, and a combined FET-type device and thyristor-type device in accordance with an embodiment of the present invention.

FIG. 4 illustrates some aspects of a non-limiting example of a power loss profile 28 (power loss, $P_{LOSS}$, plotted against current, I) of the at least one FET-type device 24, a power loss profile 30 of the at least one thyristor-type device 26, and a combined power loss profile 32, which reflects the power loss associated with the at least one FET-type device 24 and the at least one thyristor-type device 26 operating in parallel, and sharing the current passing through switch 20. In one form, the current sharing is natural current sharing. In other embodiments, the sharing may be forced, e.g., based on controlling the outputs of the at least one FET-type device 24 and the at least one thyristor-type device 26 using gate driver 22. In some embodiments, sharing may take place at any current level, e.g., above threshold voltage for the at least one thyristor-type device 26. In some embodiments, the current flow passing through switch 20 may not be shared at any given current level, but rather may be shared insofar as the at least one FET-type device 24 transmitting all current at lower current regimes, e.g. below some predetermined threshold value, with the at least one thyristor-type device transmitting all current in higher current regimes, e.g., above the threshold value. For example, gate driver 22 may be employed to turn off the at least one FET-type device 24 at higher currents, e.g., currents above rated current or some other threshold value, and/or may be employed to turn off the at least one thyristor-type device 26, e.g., at currents at or below rated current or some other threshold value.

The intersection of power loss profile 28 with power loss profile 30 defines a threshold current $I_k$, i.e., the current flow at which at which the power loss through the at least one FET-type device 24 equals the power loss through the at least one thyristor-type device 26. In other embodiments, another correlation between the power loss profile of the at least one FET-type device 24 and the power loss profile of the at least one thyristor-type device 26 may be used to determine threshold current $I_k$. In some embodiments, the at least one FET-type device 24 and the at least one thyristor-type device 26 are selected and constructed to have power loss profiles 28 and 30 that achieve a desired threshold current $I_k$. For example, the solid state device design parameters for each of the at least one FET-type device 24 and the at least one thyristor-type device 26 may be selected and varied to achieve a desired threshold current $I_k$. Design parameters may include, for example and without limitation, on state resistance, voltage-current characteristic, resistance of the drift region, resistance of the channel, n and p material doping parameters, n and p material layer thickness, etc. By varying or manipulating the design parameters, a construction of the at least one FET-type device 24 and the at least one thyristor-type device 26 having the desired threshold may be achieved. The at least one FET-type device 24 is constructed with a power loss profile (e.g., power loss profile 28) based on the rated current, e.g., constructed to have or achieve a power loss profile based on the rated current, wherein the power losses below rated current are less than that of the at least one thyristor-type device 26 at the same current. The at least one thyristor-type device 26 is constructed with a power loss profile (e.g., power loss profile 28) based on currents above rated current, e.g., a surge current, such as an inrush current and a start current or other surge associated with electrical device 18. For example, the at least one thyristor-type device 26 is constructed to have or achieve a power loss profile based on surge currents, wherein the power losses above rated current are less than that of the at least one FET-type device 24 at the same current.

In one form, threshold current $I_k$ is or is approximately the rated current for electrical device 18. The at least one FET-type device 24 is selected and constructed to provide current to electrical device 18 at current levels up to the threshold current $I_k$, e.g., the rated current. In various embodiments, this current flow provided by the at least one FET device 24 may be most or all of the current output by switch 20 below the rated current level. The at least one thyristor device 26 may be selected and constructed to provide a current flow to the electrical machine in excess of the threshold current. In various embodiments, this current flow provided by the at least one thyristor device 26 may be most or all of the current output by switch 20 above the rated current level, e.g., up to and including surge currents, such as any inrush currents, motor start currents or other overcurrents. The at least one FET-type device 24 is selected and constructed to have a lower power loss than the at least one thyristor-type device 26 below the rated current. The at least one thyristor-type device 26 is selected and constructed to have a lower power loss than the at least one FET-type device above the rated current, e.g., at the inrush current and start current associated with the electrical device. In other embodiments, threshold current $I_k$ is a current level greater than rated current for electrical device 18. In still other embodiments, threshold current $I_k$ may be a current level that is lower than rated current for electrical device 18.

Figure 3:
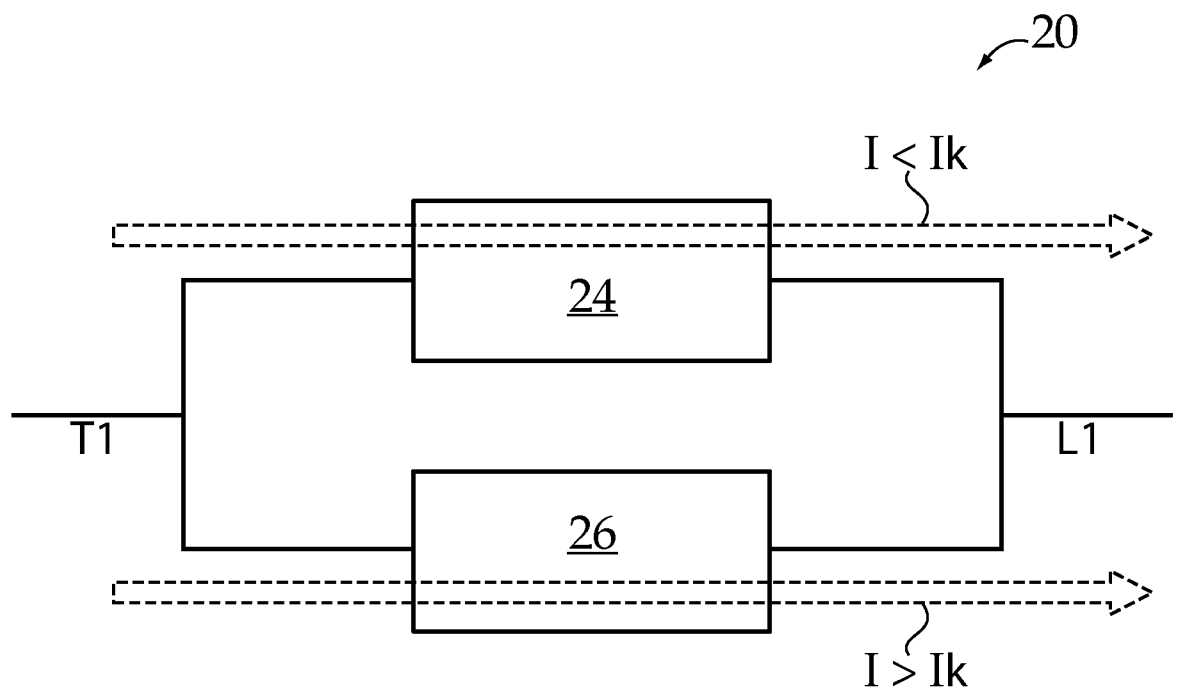
FIG. 3 schematically illustrates some aspects of a non-limiting example of a solid state switch and representative current flows during operation above and below a current threshold in accordance with an embodiment of the present invention.

At currents below threshold current $I_k$, the loss profile of the at least one FET-type device 24 dominates or primarily influences the combined loss profile 32, whereas at currents above threshold current $I_k$, the loss profile of the at least one thyristor-type device 26 dominates or primarily influences the combined loss profile 32. In some embodiments, the combined power loss profile 32 essentially or effectively overlays power loss profile 28 at current levels below threshold current $I_k$, and essentially or effectively overlays power loss profile 28 at current levels above threshold current $I_k$. In such embodiments, at current levels below threshold current $I_k$, essentially all the current passes through the at least one FET-type device 24, whereas at current levels above threshold current $I_k$, essentially all the current passes through the at least one thyristor-type device 26, as illustrated in FIG. 3.

In one form, gate driver 22 is constructed and operative to provide a continuous on signal to the gate(s) of the at least one FET-type device 24, while switch system 14 is turned on, e.g., during steady state operation. In some embodiments, gate driver 22 may be constructed and operative to provide an off signal to the gate(s) of the at least one FET-type device 24 at current levels above rated current or above threshold current $I_k$. In one form, gate driver 22 is constructed to provide a continuous off signal to the gate(s) of the at least one thyristor-type device 26 during steady state operation of electrical device 18 or operation below rated current, and to provide an on signal to the gate(s) of the at least one thyristor-type device 26 to the gate during surges above rated current, e.g., pulsed on signals or a single on signal if the thyristor-type device is forward biased, or a continuous on signal for some types of thyristor-type devices.

In some embodiments, one or more gate drivers 22 may be constructed to turn off the thyristor-type device with a delay that can be tuned to achieve retriggering and zero current turn-off. In some embodiments, one or more gate drivers 22 may be constructed to provide the at least one FET-type device with turn-on and turn-off delay that can be tuned to coordinate the current sharing between devices. Embodiments may include one or more power semiconductor control circuits for the thyristor-type devices, and one or more power semiconductor control circuits for the FET-type devices.

In various embodiments, thyristor type device 26 may be, for example and without limitation, one or more thyristors and/or SCRs and/or TRIACs. In some embodiments, one or more thyristors may be substituted with bipolar devices. Thyristor-type device 26 may also be or include one or more integrated gate-commutated thyristors (IGCTs), insulated-Gate Bipolar Transistors (IGBTs), gate turn-off thyristors (GTOs), and MOS-controlled thyristors (MCTs).

The at least one FET-type device 24 may be, for example and without limitation, two three quadrant FETs in back-to-back or anti serial configuration, or one four quadrant FET. The three quadrant FET-type device may be, for example and without limitation, a SiC Junction gate field-effect transistor (JFET), SiC JFET in Cascode configuration with Si MOSFET or GaN MOSFET, a SiC Metal Oxide Semiconductor Field-Effect Transistor (MOSFET), SiC Junction gate field-effect transistor with an anti parallel diode, a SiC Metal Oxide Semiconductor Field-Effect Transistor with an anti parallel diode, or other types of three quadrant FET devices. The four quadrant FET-type device may be, for example and without limitation, a GaN four quadrant FET, a symmetrical normally-ON SiC JFET, or a dual-gate normally-ON GaN HEMT, or other types of four quadrant FET devices. FET-type device 24 may also be or include one or more of a GaN High-Electron-Mobility Transistor (HEMT), GaN field-effect transistor (FET), a GaN Enhancement mode HEMT (E-HEMT), a Si Metal Oxide Semiconductor Field-Effect Transistor (MOSFET), a Si Junction gate field-effect transistor (JFET), a Si Super Junction MOSFET and Wide-Band Gap, SiC, GaN, Diamond semiconductor devices. Diodes, e.g., employed in the Cascode configuration, may include, for example and without limitation, one or more of a Pn diode, Schottky diode, an SiC Schottky diode, or one or more other diode types. Although illustrated with respect to a Cascode configuration, it will be understood that in some embodiments, diodes may be used in conjunction with other FET-type devices as well, e.g., as freewheeling diodes.

Figure 5:
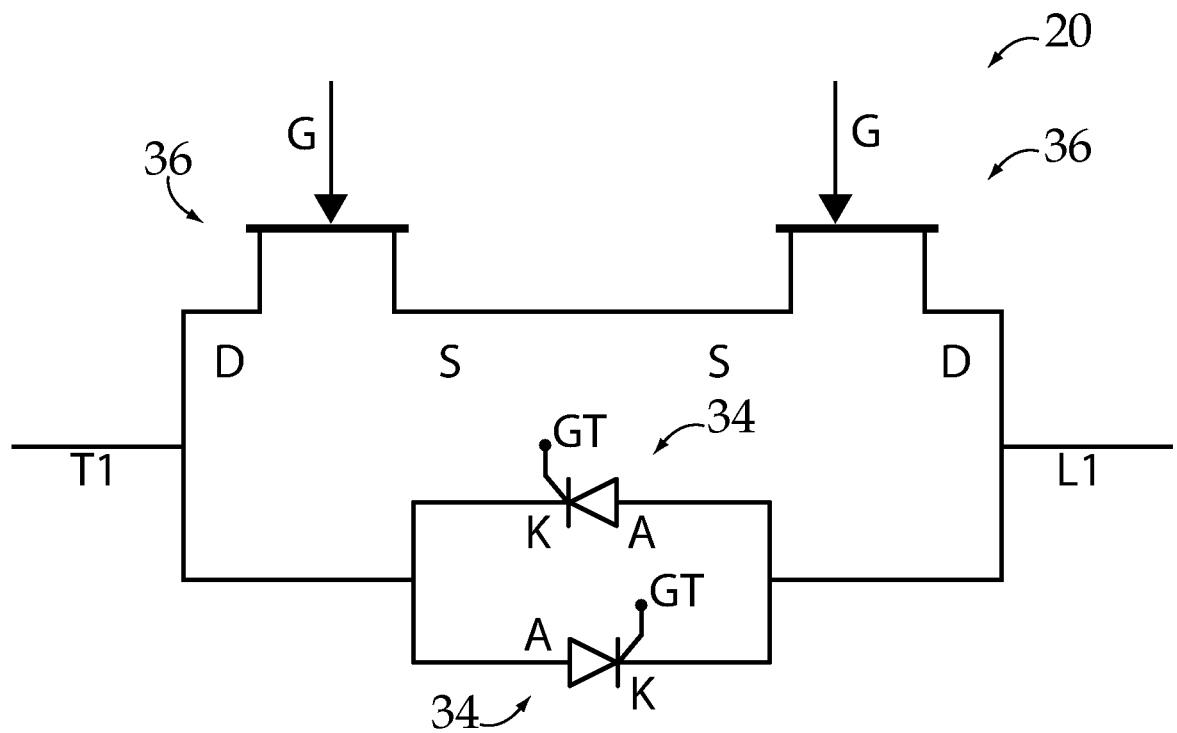
FIG. 5 schematically illustrates some aspects of a non-limiting example of a solid state switch in accordance with an embodiment of the present invention.
Figure 6:
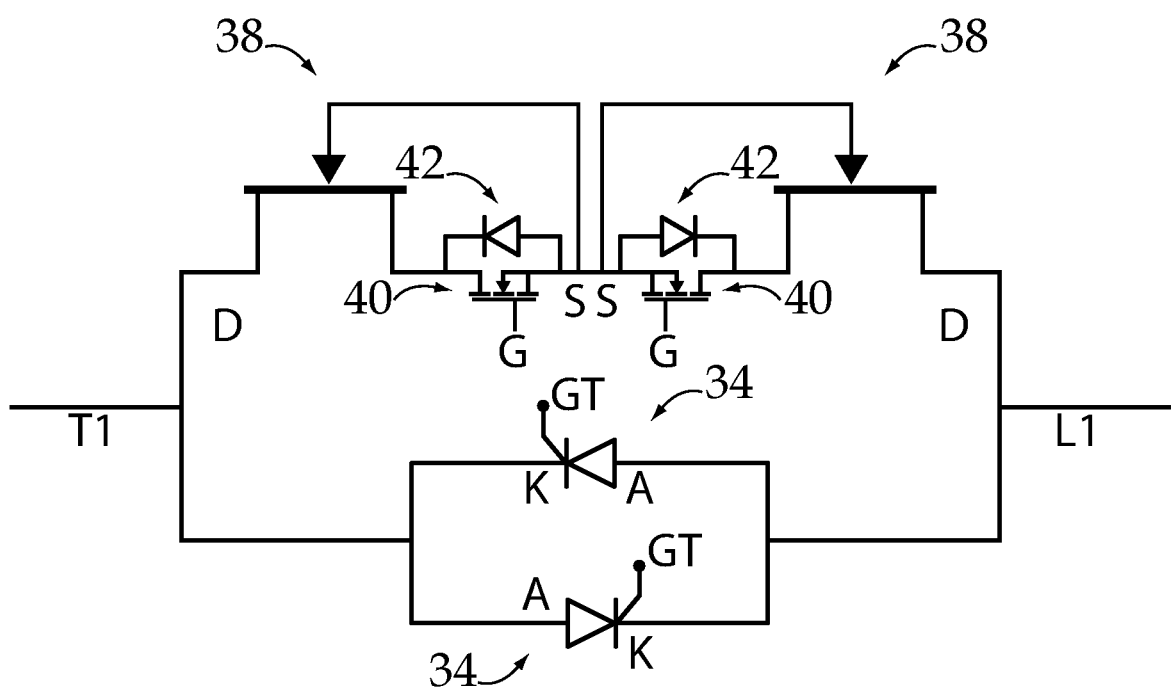
FIG. 6 schematically illustrates some aspects of a non-limiting example of a solid state switch in accordance with an embodiment of the present invention.
Figure 7:
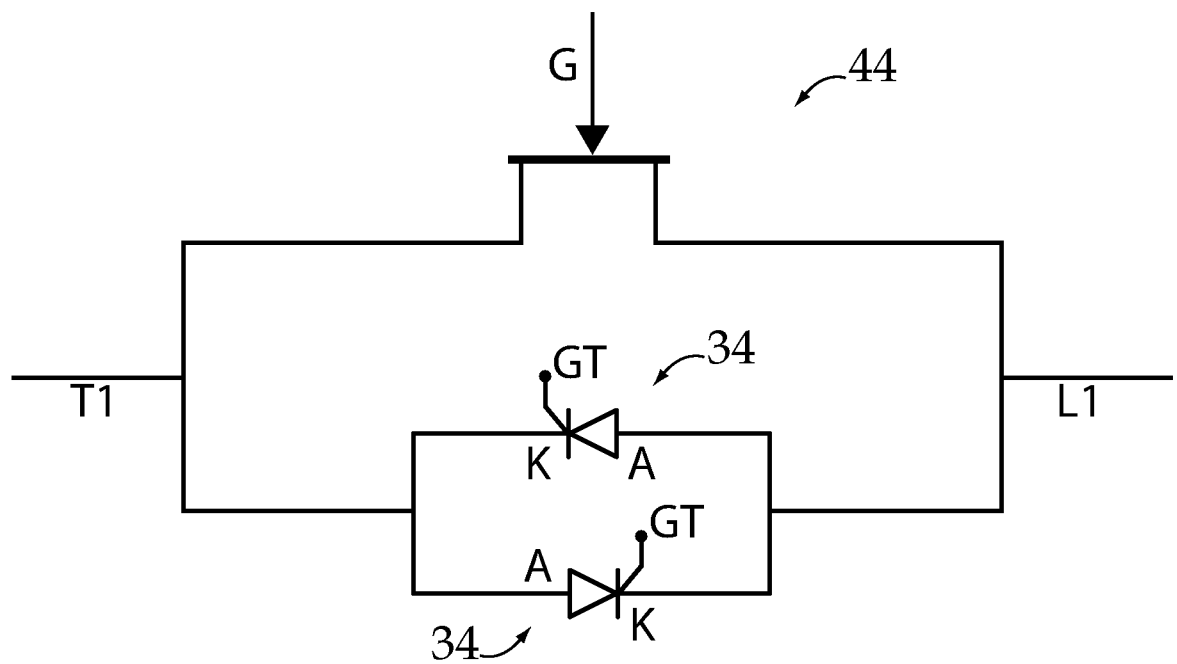
FIG. 7 schematically illustrates some aspects of a non-limiting example of a solid state switch in accordance with an embodiment of the present invention.
Figure 8:
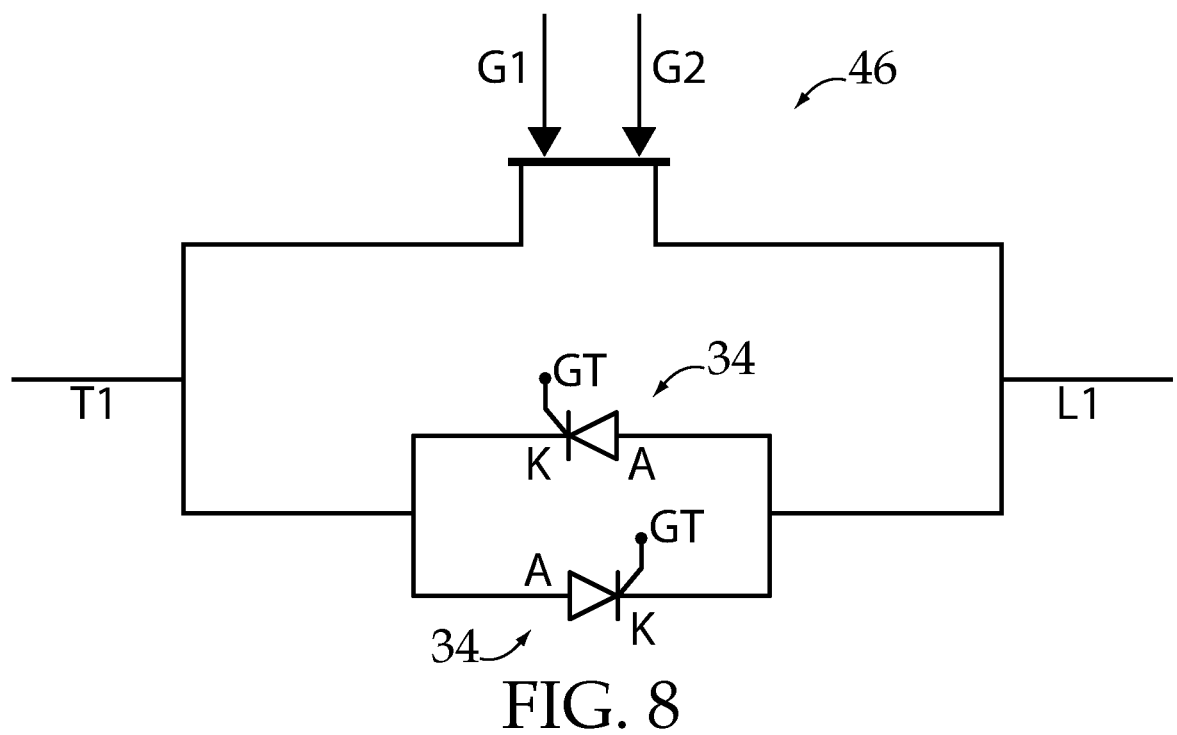
FIG. 8 schematically illustrates some aspects of a non-limiting example of a solid state switch in accordance with an embodiment of the present invention.

Referring to FIGS. 5-8, the at least thyristor-type device 26 may be a single thyristor-type device in some embodiments, and in other embodiments may be or include a first thyristor-type device 34 coupled to terminal T1 and to terminal L1 in parallel with the at least one FET-type device 24; and a second thyristor-type device 34 coupled to terminal T1 and to terminal L1 anti parallel to the first thyristor-type device 34. Each thyristor-type device 34, e.g., each thyristor, has an anode A, a cathode K and gate GT. The embodiment of FIG. 5 illustrates wherein the at least one FET-type device 24 is two three quadrant FETs 36 coupled in anti series, each FET 36 having a gate G, a source S and a drain D. The embodiment of FIG. 6 illustrates wherein the at least one FET-type device is two Cascode JFETs 38 with corresponding low voltage MOSFETs 40 and freewheeling diodes 42, each Cascode JFET having a having a gate G, a source S and a drain D. The embodiment of FIG. 7 illustrates wherein the at least one FET-type device is a four quadrant FET 44 having a gate G. The embodiment of FIG. 8 illustrates wherein the at least one FET-type device is a four quadrant dual-gate FET 46 having two gates G1 and G2. It will be understood that other combinations of FET-type devices and thyristor-type devices may be employed in various embodiments of the present invention.

Figure 9:
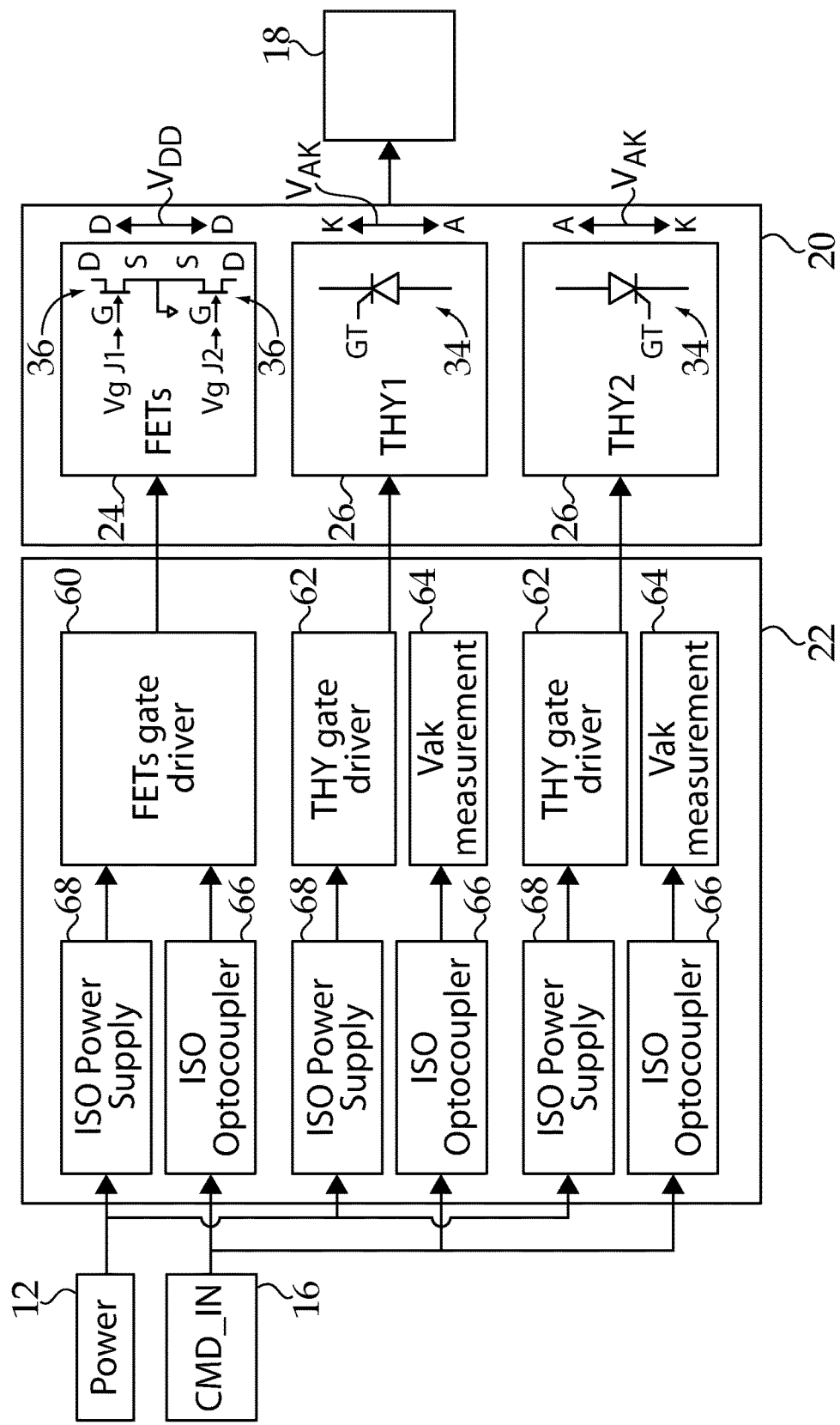
FIG. 9 schematically illustrates some aspects of a non-limiting example of a control circuit for controlling at least one FET-type device and at least one thyristor-type device in accordance with an embodiment of the present invention.

Gate driver 22 includes gate driver circuits operative to send gate drive signals to the at least one FET-type device 24 and the at least one thyristor-type device 26, and in various embodiments also includes other components and features in addition to gate driving circuits, e.g., components and features for supplying power and information or other quantities, e.g., voltage, current, or other forms of information, for operating the gate driver circuits. For example, in various embodiments, gate driver 22 may include power supplies, such as isolated power supplies; processing devices such as microprocessors, programmable logic devices, or other forms of processing devices, logic circuits, one or more of various types of controllers, control circuits and the like; optocouplers, pulse current transformers; transformers of various other types and/or other types of isolators and/or isolated circuits; isolated and/or non-isolated measurement circuits and systems, e.g., for measuring voltage, current and/or other quantities; and other electrical/electronic features, components and systems used ultimately to provide gate drive signals to the FET-type device(s) and thyristor-type devices, including by or in conjunction with other electrical/electronic features, components and systems not mentioned herein. An example of components included as part of gate driver 22 is illustrated in the embodiment of FIG. 9, wherein gate driver 22 includes a FET device gate driver circuit 62; a thyristor (THY) gate driver circuit 62 for each thyristor-type device; a voltage $V_{AK}$ measurement circuit 64 for each thyristor gate driver circuit 62; an isolator (ISO) in the form of an optocoupler 66 for the FET device gate driver circuit 60 and for each thyristor gate driver circuit 62 and $V_{AK}$ measurement 64 circuit pair; and an isolated (ISO) power supply 68 for each of the FET device gate driver circuit 60 and the thyristor gate driver circuits 62. Other components and features may be included as part of gate driver 22 in addition to or in place of those illustrated in FIG. 9.

In some embodiments, thyristor-type devices and FET-type devices are used in such a manner as to manage, and in some embodiments, to optimize, the thermal load among thyristor-type devices and FET-type devices, and in some embodiments to ultimately increase the power density of solid state switch system 14 or solid state switch 20.

Some embodiments include control methods and systems that permit coordination of thyristor-type devices and FET-type devices in order to manage current sharing between the thyristor-type devices and FET-type devices, and in some embodiments to provide optimum current sharing, and optimum sharing of the thermal load. Some embodiments provide zero current turn-off, which may provide for high number of turn-off operations, e.g., relative to embodiments that do not employ zero current turn-off.

Some embodiments include control methods and systems that may improve, and in some embodiments, may maximize the power density/cost ratio for solid state switches, e.g., contactors for motor control applications and solid state relays and contactors with high current ratings.

Some embodiments include control methods and systems that may improve, and in some embodiments, may maximize the power density/cost ratio and increase number of operations for solid state circuit breakers, contactors, relays, and switches.

In some embodiments, current sharing or splitting, sharing or splitting of the thermal load, and zero current turn-off, may include the control circuit sending a current pulse to the thyristor-type devices with a particular timing. For example, in some embodiments, the thyristor-type devices are activated by sending a current pulse when the thyristor is both forward biased and the voltage across the thyristor is higher than the embedded knee voltage of the thyristor. Various embodiments include the provision of accurate timing and coordination between devices, and may avoid undesirable overcurrent and overvoltage.

Embodiments of the present invention include controlling at least one FET-type device 24 and at least one thyristor-type device 26, e.g., such devices as described above with respect to FIGS. 1-8. In some embodiments, two thyristor-type devices in antiparallel and two FET-type devices in back-to-back configuration connected in parallel with the thyristor-type devices are controlled. Some embodiments include controlling two thyristor-type devices in antiparallel and one four quadrant FET-type device connected in parallel with the thyristor-type devices.

Figure 10:
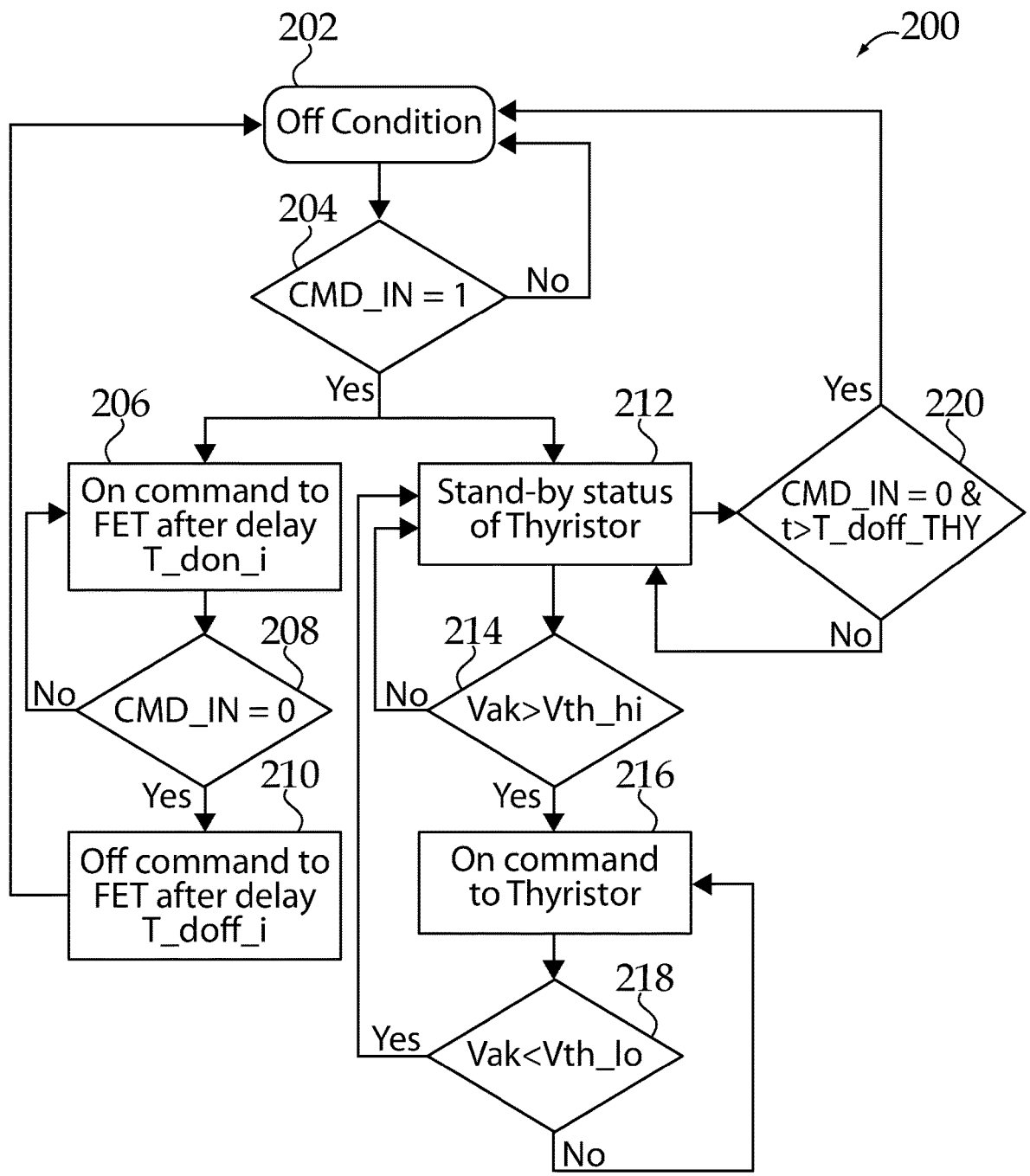
FIG. 10 schematically illustrates some aspects of a non-limiting example of a control algorithm for coordinating the output of at least one FET-type device and at least one thyristor-type device in accordance with an embodiment of the present invention.

Referring to FIGS. 10-14, some aspects of non-limiting a example of an embodiment of the present invention is illustrated. FIG. 10 illustrates some aspects of a non-limiting example of a control algorithm 200 in accordance with an embodiment of the present invention that may be employed to coordinate at least one FET-type device and at least one thyristor-type device in order to control current sharing and zero current turn-off, which in some embodiments may improve thermal load management, power density/cost ratio, and an extended number of operations and lifetime of solid state switch 20.

Figure 11:
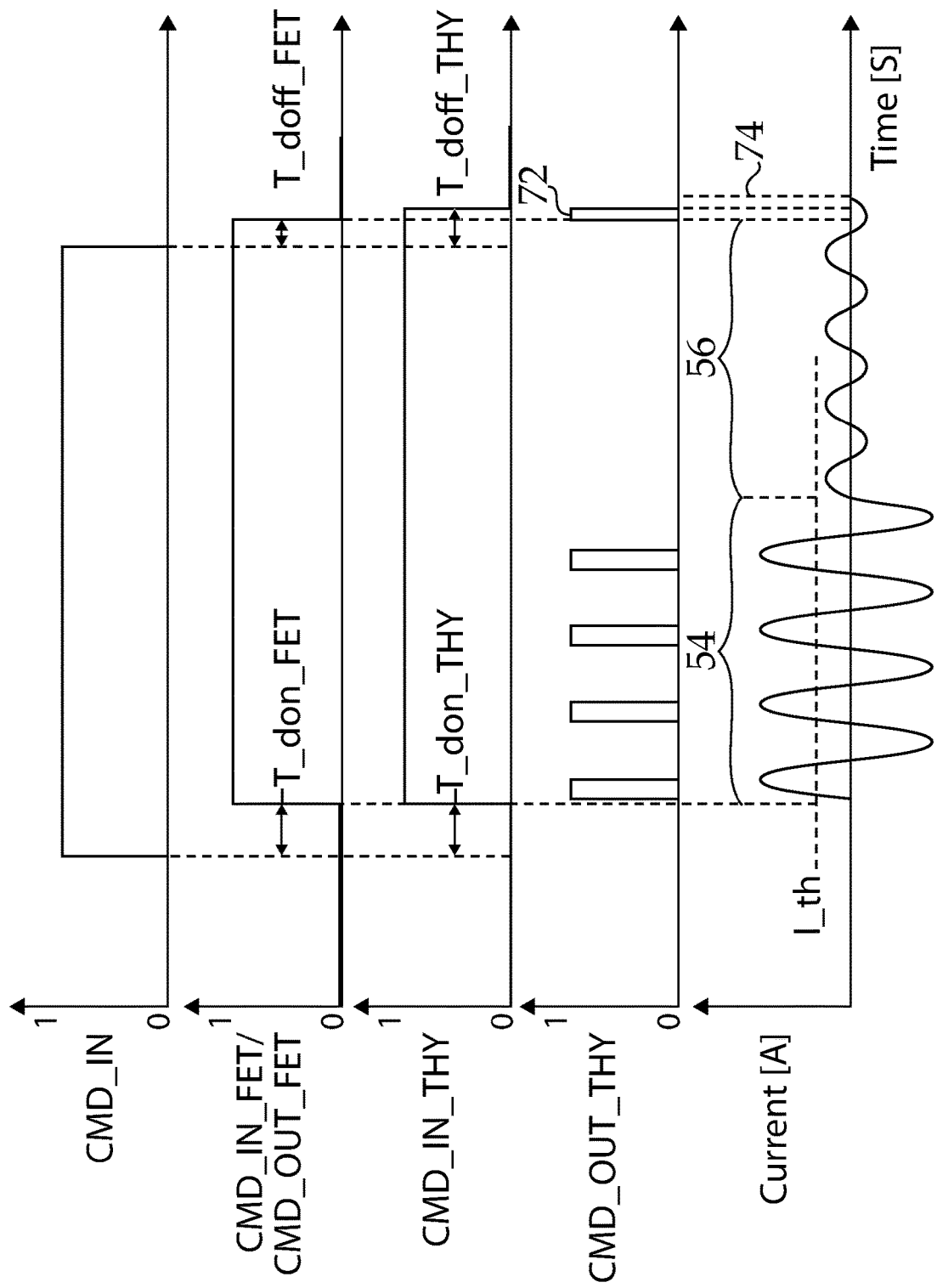
FIG. 11 schematically illustrates some aspects of a non-limiting example of logic and command/control signals for controlling at least one FET-type device and at least one thyristor-type device in accordance with an embodiment of the present invention.

FIG. 11 schematically illustrates some aspects of a non-limiting example of logic and command/control signals for operating and controlling at least one FET-type device 24 and at least one thyristor-type device 26 in accordance with an embodiment of the present invention. In some embodiments, the control algorithm of FIG. 10 may be employed to generate the command and control signals illustrated in FIG. 11. In some embodiments, the operation and the control signals for the at least one FET-type device 24 and the at least one thyristor-type device 26 may improve and in some embodiments optimize thermal balance, and provide zero current turn-off, which in some embodiments may increase the life of the at least one FET-type device 24 and the at least one thyristor-type device 26, e.g., allowing for a higher number of operations than conventional solid state switches. The operation and control of the at least one FET-type device 24 and the at least one thyristor-type device 26 are illustrated during both surge current conditions 54 and nominal current conditions 56.

Figure 12:
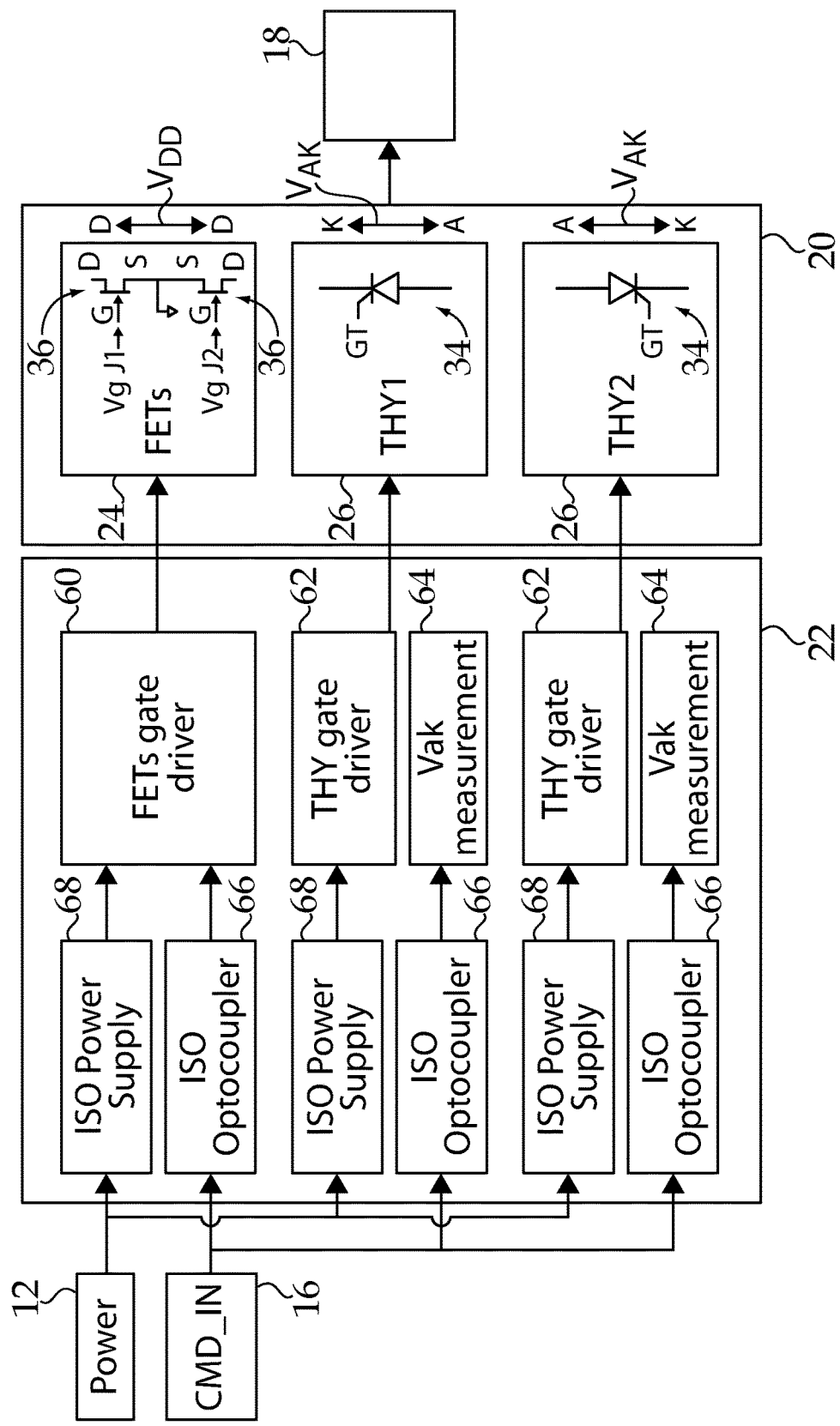
FIG. 12 schematically illustrates some aspects of a non-limiting example of a control circuit for controlling at least one FET-type device and at least one thyristor-type device in accordance with an embodiment of the present invention.

FIG. 12 schematically illustrates some aspects of a non-limiting example of a realization of control circuit for controlling at least one FET-type device and at least one thyristor-type device in accordance with an embodiment of the present invention. In some embodiments, the control circuits illustrated in FIGS. 12-14 may implement the control algorithm and command/control signals of respective FIGS. 10 and 11. Other embodiments may also implement the control algorithm and command/control signals of respective FIGS. 10 and 11.

Figure 13:
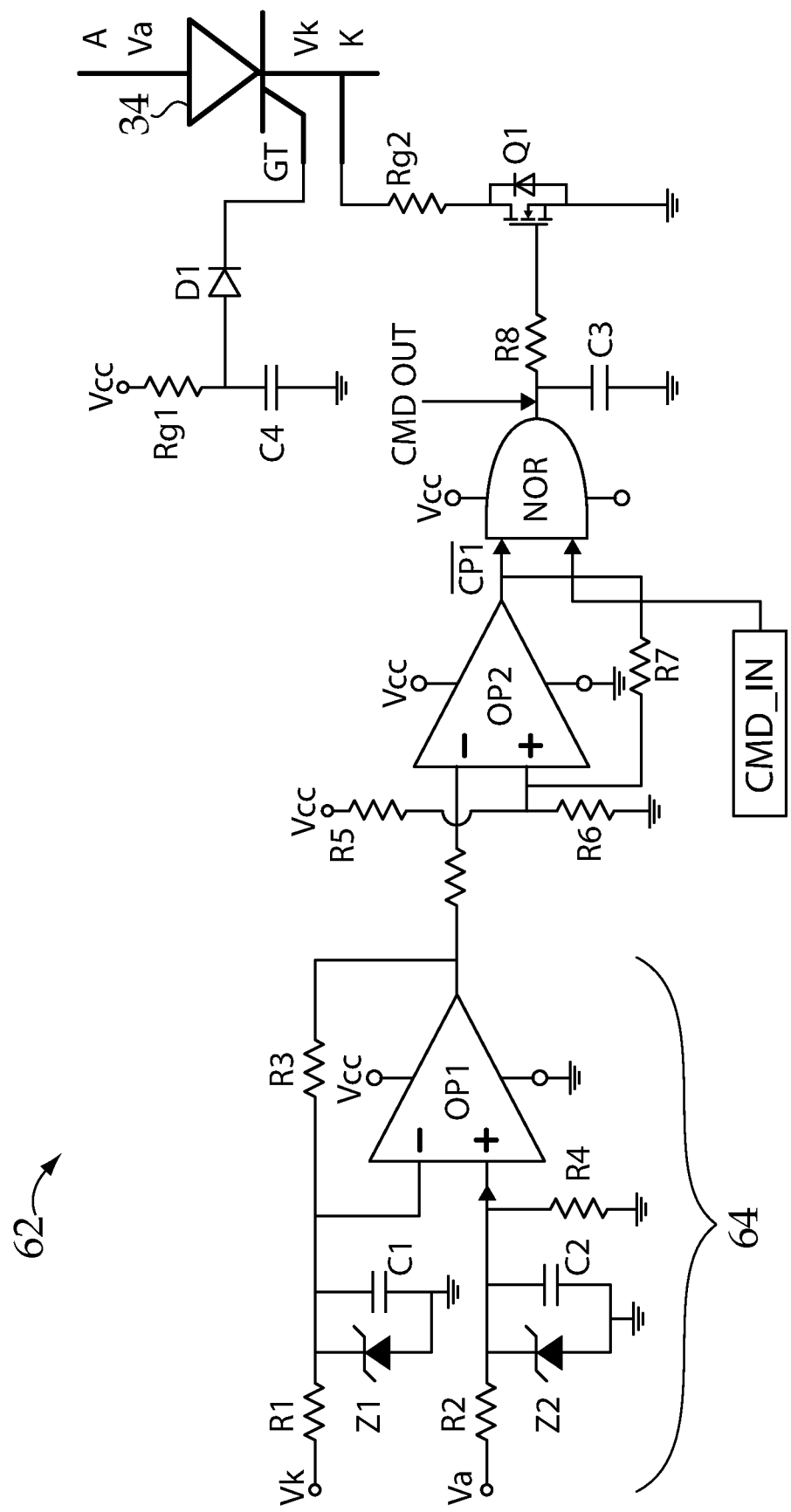
FIG. 13 schematically illustrates some aspects of a non-limiting example of a realization of a gate driver circuit for a thyristor-type device in accordance with an embodiment of the present invention.

FIG. 13 schematically illustrates some aspects of a non-limiting example of a realization of a gate driver circuit for a thyristor-type device in accordance with an embodiment of the present invention, which includes thyristor gate driver circuit 62 and $V_{AK}$ measurement 64. In the illustrated embodiment, gate driver circuit 62 is coupled to the gate (GT) and cathode (K) of the thyristor 34 and is operative to drive a current pulse (gate drive signal) through the gate of the thyristor to cause the turn-on (latching) of the thyristor. In other embodiments, other gate driver circuits and/or related circuits may be employed in addition to or in place of thyristor gate driver circuit 62 and/or $V_{AK}$ measurement 64. It will be understood that the gate driver circuit 62 and $V_{AK}$ measurement 64 are but one example of a gate driver circuit and a measurement circuit that may be employed in embodiments of the present invention, and that in other embodiments, other forms of gate driver circuits and/or measurement circuits may be employed. Some embodiments may employ a gate driver circuit without a measurement circuit. In some embodiments, a programmable logic controller, microprocessor or other controller may be employed to function as all or part of thyristor gate driver circuit 62 and/or $V_{AK}$ measurement 64 to determine voltage $V_{AK}$ and or current, and to generate gate drive signals for driving the gates of or activating/deactivating the at least one thyristor-type device 26.

Figure 14:
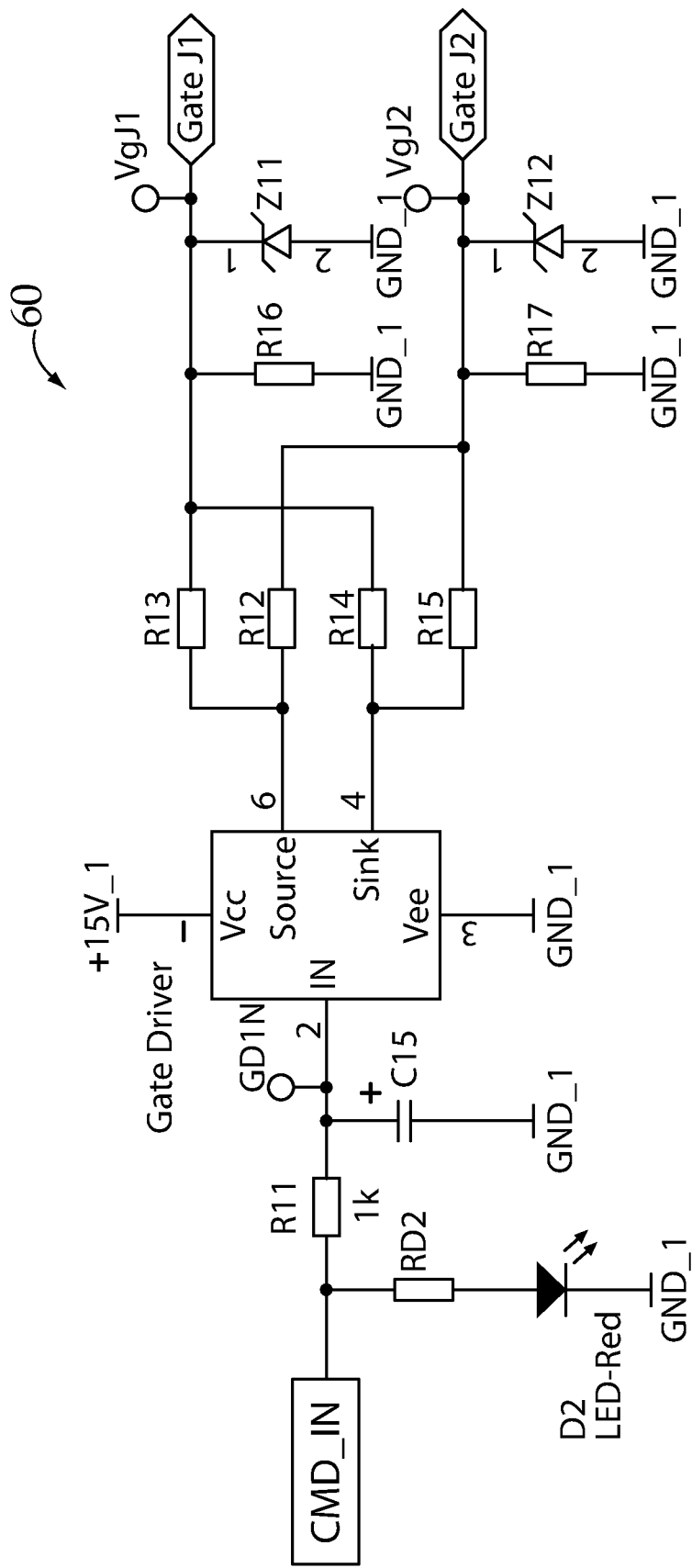
FIG. 14 schematically illustrates some aspects of a non-limiting example of a realization of a gate driver circuit for a FET-type device in accordance with an embodiment of the present invention.

FIG. 14 schematically illustrates some aspects of a non-limiting example of a realization of a FET gate driver circuit 60 for at least one FET-type device in accordance with an embodiment of the present invention. In other embodiments, other gate driver circuits and/or related circuits may be employed in addition to or in place of FET gate driver circuit 60. In some embodiments, a programmable logic controller, microprocessor or other controller may be employed to function as all or part of FET gate driver circuit 60 to generate gate drive signals for driving the gates of the at least one FET-type device 24.

In the embodiment of FIGS. 10-14, the at least one FET-type device 24 is a pair of three-quadrant FET devices 36 arranged in anti-series, e.g., as illustrated in FIG. 5, although any FET-type device/arrangement described herein may be employed. The FET-type devices are provided with gate drive signals from FET gate driver circuit 60 coupled to the gates G of the FET. The at least one thyristor-type device 26 is a pair of thyristors 34 arranged in parallel to the at least one FET-type device 24 and in antiparallel to each other, e.g., as illustrated in FIG. 5, although any thyristor-type device/arrangement described herein may be employed. The thyristor-type devices are provided with gate signals from thyristor (THY) gate driver circuits 62, e.g., one for each thyristor 34.

FIG. 12 illustrates some aspects of a non-limiting example of an electrical system and a control circuit in accordance with an embodiment of the present invention. The control circuit of FIG. 12 is operative to coordinate the operation of the at least one FET-type device 24 and the at least one thyristor-type device 26. In one form, one control or gate drive circuit (e.g., FETs gate driver circuit 60 of FIG. 12, a non-limiting example of which is illustrated in FIG. 14) is used to control the at least one FET-type device 24. Two control circuits (e.g., the THY gate driver circuits 62 of FIGS. 12 and 13) provide gate drive signals to the at least one thyristor-type device 26, in conjunction with $V_{ak}$ measurement circuits (e.g., $V_{AK}$ measurement 64), optocouplers 66, and isolated (ISO) power supplies 68, in the embodiment of FIG. 12. In some embodiments, a gate driver circuit may be employed for each component or switching element (e.g., FET 36) of the at least one FET-type device 24, e.g., each FET-type device, and the at least one thyristor-type device 26, e.g., each thyristor-type device, whereas in other embodiments, gate signals for a plurality of switching devices may be provided by a single gate driver circuit.

In the embodiment of FIG. 12, gate driver 22 includes gate driver circuit 60; two (2) gate driver circuits 62; two (2) $V_{AK}$ measurement circuits 64; three (3) isolators, e.g., optocouplers 66; and three isolated power supplies 68. Isolated power supplies 68 are coupled to power source 12, and coupled to respective gate driver circuits 60, 62. Isolated power supplies 68 are operative to supply an isolated power signal to the respective gate drivers for generating gate drive signals for the FET-type devices and thyristor-type devices. Gate driver circuit 60 is coupled to the gate(s) of the at least one FET-type device 24, e.g., to gates G of each FET 36, also identified as J1 and J2 in FIG. 12, and are operative to provide gate signals to the gates, e.g., Vg J1 and Vg J2 for turning on or activating the FET-type devices and turning off or deactivating the FET-type devices for respectively connecting and disconnecting electrical device 18 from power source 12 on the FET-type device side of solid state switch 14. In one form, gate driver circuit 60 is constructed and operative to provide a continuous or constant gate drive signal, e.g., continuously on (e.g., 1 or high) or continuously off (e.g., 0 or low). That is, in the embodiment of FIG. 12, FETs 36 are not pulsed, but are either continuously on or continuously off for periods of time exceeding a full sine wave cycle of the power supplied by power source 12 to electrical device 18.

In one form, gate driver circuit 60 is constructed and operative to provide gate drive signals to activate the at least one FET-type device 24 (e.g., FETs 36) continuously during operation under both nominal current and surge current conditions. In other embodiments, gate driver circuit 60 may be constructed and operative to provide gate drive signals to activate the at least one FET-type device 24 (e.g., FETs 36) only during nominal current conditions. In still other embodiments, gate driver circuit 60 may be constructed and operative to provide discontinuous gate drive signals, e.g., pulsed gate drive signals during nominal and surge current conditions or during nominal current conditions alone.

Gate driver circuit 62 is coupled to the gate(s) of at least one thyristor-type device 26, e.g., to gates GT of each thyristor 34 (and in some embodiments also to the cathodes), and operative to provide gate signals to the gates for turning on or activating the thyristor-type devices and turning off or deactivating the thyristor-type devices for respectively connecting and disconnecting electrical device 18 from power source 12 on the thyristor-type device side of solid state switch 14. In one form, gate driver circuit 62 is constructed and operative to provide pulsed gate drive signals to the respective thyristor 34. In other embodiments, gate driver circuit 62 may be constructed and operative to provide gate drive signals to activate the at least one thyristor-type device 26 (e.g., thyristors 34) only during surge current conditions. In other embodiments, gate driver circuit 62 may be constructed and operative to provide the gate signals to activate the at least one thyristor-type device 26 (e.g., thyristors 34) during both nominal and surge current conditions. Some embodiments may employ a single gate driver circuit 62 and a single thyristor-type device associated optocoupler 66 or other isolator, and/or a single thyristor-type device associated isolated power supply 68, whereas other embodiments may employ more than one thyristor-type device associated gate driver circuit 62, optocoupler 66 and/or isolated power supply 68 e.g., one gate driver circuit 62, isolator 66 and/or isolated power supply 68 each per thyristor-type device.

$V_{AK}$ measurement circuits 64 are coupled to the anode (A) and cathode (K) of the respective thyristors 34, and to the respective gate driver circuits 62. $V_{AK}$ measurement circuits 64 are operative to sense the voltage $V_{AK}$ across each thyristor 34, compare the voltage with a high threshold (Vth_hi in FIG. 10) and with a low threshold (Vth_lo in FIG. 10). Gate driver circuit 62 is operative to activate the respective thyristor 34 or deactivate the respective thyristor 34 based on the comparison.

Optocouplers 66 are coupled to command input 16 and to respective gate driver circuit 60 and gate driver circuits 62. Optocouplers 66 are constructed and operative to receive a command signal (CMD_IN) from command input 16 and provide an isolated command signal to the respective gate driver circuits.

In order to operate switch system 14 to connect electrical device 18 to power source 12 or disconnect electrical device 18 from power source 12, the command signal (CMD_IN) from command input 16 is utilized. When the command signal is high (1), switch 14 is turned on, and when the command signal is low (0), switch 14 is turned off. Referring to algorithm 200 of FIG. 10, in the present embodiment, the description encompassing blocks 202-210 are performed for the at least one FET-type device; and the description encompassing blocks 202, 204 and 212-220 are performed independently for each thyristor-type device, e.g., an execution for the thyristor-type device conducting the positive voltage/current operating in parallel to an execution for the thyristor-type device conducting the negative voltage/current. Other embodiments may execute the algorithm differently.

Starting at block 202, solid state switch 14 is in the off condition. At block 204, a determination is made as to whether the command signal (CMD_IN) is high or low (e.g., 1 or 0, respectively). If the command signal is high (CMD_IN=1), at block 206 an "on" command gate drive signal (CMD_IN_FET/CMD_OUT_FET=1) is sent to FETs 36 to activate FETs 36 after a time delay (T_don_i in FIG. 10, T_don_FET in FIG. 11). If the command signal is low, solid state switch system 14 remains in the off condition, wherein electrical device 18 is not connected to power source 12. At block 208, if the command signal is low (CMD_IN=0), an "off" command gate drive signal (CMD_IN_FET/CMD_OUT_FET=0) is sent to deactivate FETs 36 after a time delay (T_doff_i in FIG. 10, T_dof_FET in FIG. 11), placing the FETs 36 in the off condition of block 202. If the command signal is not low at block 208, FETs 36 remain activated. Thus, when the command signal (CMD_IN) (e.g., command input 16) becomes high, the at least one FET-type device 24 turns on with a predetermined delay (T_don_i in FIG. 10, T_don_FET in FIG. 11), and conducts current to electrical device 18; when the command signal then becomes low, the at least one FET-type device 24 turns off after a predetermined delay (T_doff_i in FIG. 10, T_doff_FET in FIG. 11).

After the command signal becomes high (CMD_IN=1) at block 204, the at least one thyristor-type device 26 is placed into a standby condition (CMD_IN_THY=1) after a time delay (T_don_THY in FIG. 11). That is, the input command for the at least one thyristor-type device 26 becomes high with a predetermined delay (CMD_IN_THY and time delay T_doff_THY, respectively). However, the turn-on command to the thyristor-type device, i.e., a gate drive signal to turn the thyristor-type device on (CMD_OUT_THY), is sent only when the current (or voltage in some embodiments) goes beyond a predetermined threshold. The at least one thyristor-type device 26 (e.g., thyristors 34) are only turned on or activated by the gate drive signal CMD_OUT_THY if the enabling signal, CMD_IN_THY, is high. In the embodiment of FIG. 11, the gate drive signal is a pulsed signal. In other embodiments, a continuous signal may be employed. At block 212, the at least one thyristor-type device 26 (e.g., thyristors 34) is in the standby condition or status, wherein CMD_IN_THY=1. At block 214, if voltage $V_{AK}$ is greater than a threshold Vth_hi, an "on" command gate drive signal (CMD_OUT_THY=1) is sent to thyristor 34 at block 216, else thyristor 34 remains in stand-by at block 212. At block 218, when voltage $V_{AK}$ is less than a threshold Vth_lo, thyristor 34 remains in or is placed into the standby condition at block 212, otherwise CMD_OUT_THY=1 is sent to thyristor 34 to activate thyristor 34 at block 216.

FIG. 11 illustrates the gate drive signal CMD_OUT_THY for the thyristor 34 conducting a positive voltage/current. It will be understood that a second thyristor gate drive CMD_OUT_THY 180 degrees out of phase with the illustrated gate drive signal CMD_OUT_THY is provided for the other thyristor 34, which conducts a negative voltage/current.

In one form, the threshold Vth_hi is a surge current, e.g., a current beyond rated current or some other selected nominal current value, for example, the threshold current $I_k$ described above with respect to FIGS. 1-8 and/or another threshold current value. The current may be determined, for example and without limitation, by measurement, calculation or other determination based on $V_{AK}$ across the at least one thyristor-type device 26 or $V_{DD}$ across the at least one FET-type device 24, which is essentially the same voltage as $V_{AK}$ in some embodiments. For example, in the illustrated embodiment, $V_{AK}$ is effectively representative of the current. In other embodiments, thresholds may be determined in other ways. Once the current (or voltage in some embodiments) falls back below a predetermined threshold, the turn-on command (CMD_OUT_THY) for the thyristor-type devices goes low, which in some embodiments allows the thyristor to turn off naturally at zero current crossing. In other embodiments, the thyristor-type device may be turned off at zero crossing. In one form, threshold Vth_lo is a voltage at or above the embedded knee voltage of thyristor 34. In other embodiments, other threshold values may be employed.

In one form, threshold Vth_hi represents a voltage across the at least one FET-type device 24, and hence the voltage across the at least one thyristor-type device 26, which corresponds to current flow at $I_k$, above which the at least one FET-type device would be operating in a FET-type device high power loss regime 70 (FIG. 4). For example, it is seen from FIG. 4 that, the FET power loss ($P_{LOSS}$) 28 is less than, and for the most part substantially less than, the power loss 30 of the at least one thyristor-type device 26 below current $I_k$, i.e., in a low power loss regime 68, whereas the power loss 28 of the at least one FET-type device 24 is substantially greater than the power loss 30 of the at least one thyristor-type device 26 above current $I_k$, i.e., in high loss regime 70. As losses through the at least one FET-type device 24 increase with increasing current, the voltage drop across the at least one FET-type device also increase. This voltage, e.g., measured at the anode and cathode of the at least one thyristor-type device (or $V_{DD}$ in some embodiments), is used in some embodiments as a signal to turn on the at least one thyristor-type device 26. As voltage increases above the threshold, the thyristor-type devices are turned on to share the current, allowing the FET-type devices to operate in the low loss regime 69. The at least one thyristor-type device 26 is thus turned on or activated so that current may be carried by the at least one thyristor-type device 26 in addition to the at least one FET-type device 24 (or in place of the at least one FET-type device 24 in some embodiments) during operation at current levels associated with high loss regime 70, so that the losses through the at least one FET-type device 24 are reduced by operating the FET-type device in low loss regime 69 (or eliminated in some embodiments by turning the at least one FET-type device off). Embodiments of the present invention thus share or split the current delivered to electrical machine 18.

In various embodiments of the present invention, the sharing, i.e., splitting, of the current as between the at least one FET-type device 26 and the at least one thyristor-type device 26 may be in either or both of two senses: (1) concurrent sharing; and (2) atemporal sharing. With concurrent sharing, during normal conduction operation of solid state switch 20, i.e., not during shutdown after having received a CMD_IN=0 command signal, the at least one FET-type device and the at least one thyristor-type device each conduct a portion of the current that is directed to electrical device 18 at the same time. With atemporal sharing, during normal conduction operation of solid state switch 20, i.e., not during shutdown after having received a CMD_IN=0 command signal, under certain current conditions, a first conduction path through switch 20 is employed, whereas during other current conditions, a second conduction path from the first conduction path is employed. The first conduction path is one selection of the at least one FET-type device side, the at least one thyristor-type device side, or a combination of both; and the second conduction path is another, different selection of the at least one FET-type device side, the at least one thyristor-type device side, or a combination of both. Thus, in some embodiments, atemporal sharing may include concurrent sharing under some conditions, i.e., when both the at least one FET-type device and the at least one thyristor-type device are conducting, but not all current conditions.

During shutdown conditions following normal conduction operation, e.g., after CMD_IN goes low, other forms of current sharing or current management may be employed, e.g., as described herein, wherein upon shutdown, if the at least one FET-type device is conducting, when it is deactivated, the at least one thyristor-type device is simultaneously activated, and then allowed to naturally turn-off at zero crossing by providing a low gate drive signal shortly after activation during shutdown, e.g., pulse 72. In some embodiments, the at least one thyristor-type device 26 may be turned on prior to the at least one FET-type device 24 during shutdown, rather than simultaneously.

In one form, the embodiment of FIGS. 10-14 performs both concurrent and atemporal sharing. For example, during surge current conditions, e.g., during startup of electrical device 18 or during other operating regimes or other circumstances that yield surge currents, both the at least one FET-type device 24 and the at least one thyristor-type device 26 conduct current to electrical device 18, whereas during nominal operating conditions, only the at least one FET-type device 24 conducts current to electrical device 18. In other embodiments, concurrent sharing, atemporal sharing or combinations thereof may be utilized.

When the input command (CMD_IN) goes low (CMD_IN=0), the at least one FET-type device 24 turns off after a predetermined delay (T_doff_i in FIG. 10, T_doff_FET in FIG. 11), and at block 220 the input command for the at least one thyristor-type device 26 goes low after another predetermined time delay (T_doff_THY), which in some embodiments is longer than the time delay for the at least one FET-type device 24 (T_doff_i in FIG. 10, T_doff_FET in FIG. 11). In this way, the at least one thyristor-type device 26 can be retriggered in order to conduct the current until natural zero crossing occurs. For example, in some embodiments, the time delays are configured so that the gate driver circuits 62 turn on or activate the at least one thyristor-type device 26 simultaneously with the at least one FET-type device 24 being turned off, illustrated by CMD_OUT_THY pulse 72 in FIG. 11, so that the at least one thyristor-type device 26 may conduct until zero crossing, preventing inductive energy from being dissipated through the at least one FET-type device 24 and the at least one thyristor-type device 26. Pulse 72 is timed to go low prior to the next zero crossing so that thyristor 34 can turn off or deactivate naturally at zero crossing 74. In addition, by turning the at least one thyristor-type device 26 on simultaneously with turning off the at least one FET-type device 24 or by turning the at least one FET-type 24 device off while the at least one thyristor-type device is turned on, voltage spikes associated with turning the at least one FET-type device 24 may be avoided. The turn-on and retriggering process of the at least one thyristor-type device 26 can be implemented in multiple ways. For example and without limitation, one methodology is to measure the voltage across the semiconductor switching devices and to compare the value with a high threshold for turn-on and a low threshold to disable turn-on of the at least one thyristor-type device 26 (e.g., disable turn-on if the voltage is lower in magnitude than the low threshold). Another non-limiting example of a methodology is to measure the current through the device and compare it to a high threshold for turn-on and to a low threshold to disable turn-on of the at least one thyristor-type device 26. Another non-limiting example of a methodology is to measure temperature, or other means in order to determine the instant of turn-on of the at least one thyristor-type device 26.

In some embodiments, a control circuit, e.g., gate driver 22, coordinates the operation of FET-type devices and thyristor-type devices to manage losses and in some cases achieve minimum losses, to manage load sharing and in some cases achieve optimum thermal load sharing, and to provide zero current turn-off to reduce or eliminate damage to the switch elements and provide a high number of switching operations of the switch, e.g., a long operating life.

In some embodiments, FET-type devices may be employed in order to provide high power density at nominal currents, and thyristor-type devices may be employed in order to provide high power density at surge currents, e.g., inrush currents, motor start currents, fault currents and/or other surge currents.

Some embodiments include a solid state switch system to connect and disconnect a load (e.g. resistive load, motor loads, lighting load, etc.) to/from the utility grid or power distribution unit/system that involves the combination of thyristor-type power semiconductor devices and FET-type power semiconductor e.g., semiconductor devices as described above with respect to FIGS. 1-8. In some embodiments, the conduction loss in the solid state switch system can be optimized for both nominal current operation, e.g., current at or below rated current, and surge current operation, for example and without limitation, magnetizing inrush current, and startup overcurrent (LRC) of motors, and/or other surge currents.

Figure 15:
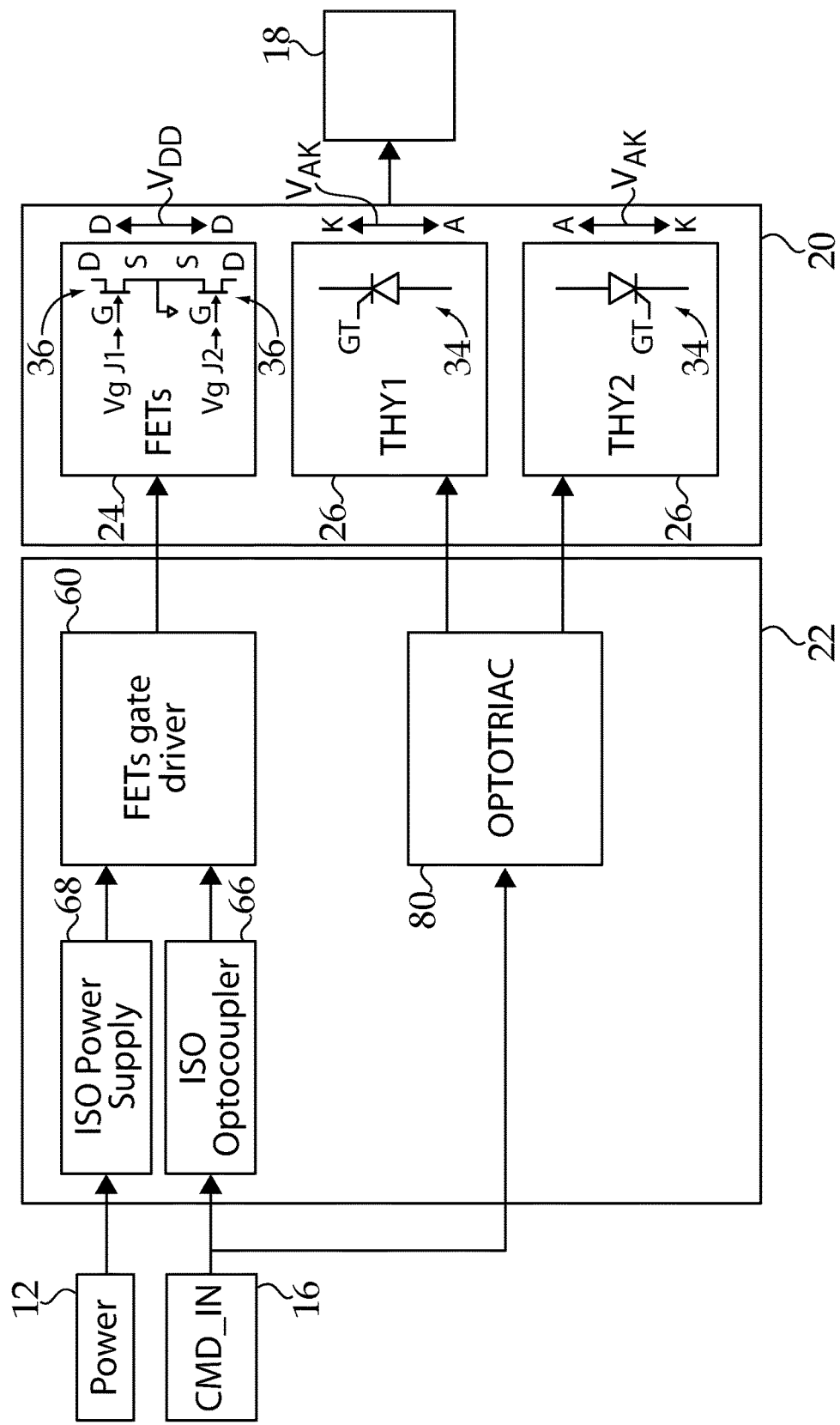
FIG. 15 schematically illustrates some aspects of a non-limiting example of a realization of a control circuit for controlling at least one FET-type device and at least one thyristor-type device in accordance with an embodiment of the present invention.

FIG. 15 schematically illustrates some aspects of a non-limiting example of a realization of control circuit for controlling at least one FET-type device 24 and at least one thyristor-type device 26 in accordance with an embodiment of the present invention. Gate driver 22 of the embodiment of FIG. 15 includes a FET gate driver circuit 60 coupled to the gate(s) of the at least one FET-type device 24 (e.g., FETs 36), an optocoupler 66 coupled to command input 16 and FET gate driver circuit 60, an isolated power supply 68 coupled to power source 12 and FET gate driver circuit 60, and an opto triac or optotriac 80 coupled to command input 16 and the at least one thyristor-type device 26. FET gate driver circuit 60, optocoupler 66, and isolated power supply 68 are similar to those described above with respect to FIG.

12. In the embodiment of FIG. 15, optotriac 80 is employed as a gate driver circuit to control the at least one thyristor-type device 26 (e.g., thyristors 34). In various embodiments, optotriac 80 may include a single optotriac device, or may include more than one optotriac device, e.g., one optotriac device per thyristor-type device.

Optotriac 80 uses the voltage across the at least one FET-type device 24 (e.g., $V_{DD}$), or across the at least one thyristor-type device 26 ($V_{AK}$), which in some embodiments is the same as $V_{DD}$, to power the gate current pulse to latch the at least one thyristor-type device 26, e.g., to latch both thyristors 34. When a voltage builds up across the thyristors 34, a gate current pulse is sent to turn on the thyristors, enabling the current to split between the at least one FET-type device 24 and the at least one thyristor-type device 26. In some scenarios, the voltage builds up due to the at least one FET-type device 24 operating in high loss regime 70, e.g., above the threshold $I_k$ of FIG. 4, e.g., as described above with respect to the embodiment of FIG. 12, and this voltage build up is used to generate gate drive signals to turn on the at least one thyristor-type device 26 for splitting the current with the at least one FET-type device 24. In some scenarios and/or in some embodiments, the voltage builds up due to the at least one FET-type device 24 intentionally being turned off, and is used to turn on the at least one thyristor-type device 26 on, e.g., in order to prevent a voltage spike stemming from turn-off of the at least one FET-type device 24. The at least one thyristor-type device 26 may then be turned off naturally upon zero current crossing, which may prevent dissipation of inductive energy into the at least one FET-type device 24 and/or the at least one thyristor-type device 26. In some embodiments, the at least one FET-type device 24 may be turned off under surge current conditions, causing the voltage build up, which results in the at least one thyristor-type device 26 turning on, thus switching the current conductance from the FET-type device side 24 of switch 20 to the thyristor-type device side 26. In some embodiments, the at least one FET-type device 24 output may be reduced but not shut off in order to activated the thyristor-type device side. In some embodiments, the at least one FET-type device 24 output may be reduced in order effect a desired current split, wherein the voltage builds up as the FET-type device 24 current output is reduced, thus turning on at least one thyristor-type device 26 to split the current between the at least one thyristor-type device 26 and the at least one FET-type device 24. The voltage build up required to turn on the at least one thyristor-type devices may vary with the needs of the application, e.g., to control the point at which the at least one thyristor-type devices turn on. The embodiment of FIG. 15 may employ some or all aspects of the logic and command/control signals for operating the at least one FET-type device 24 and the at least one thyristor-type device 24 illustrated in FIGS. 10 and 11. In one form, the embodiment of FIG. 15 performs both concurrent and atemporal sharing. For example, during surge current conditions, e.g., during startup of electrical device 18 or during other operating regimes or other circumstances that yield surge currents, both the at least one FET-type device 24 and the at least one thyristor-type device 26 conduct current to electrical device 18, whereas during nominal operating conditions, only the at least one FET-type device 24 conducts current to electrical device 18. In other embodiments, concurrent sharing, atemporal sharing or combinations thereof may be utilized.

Figure 16:
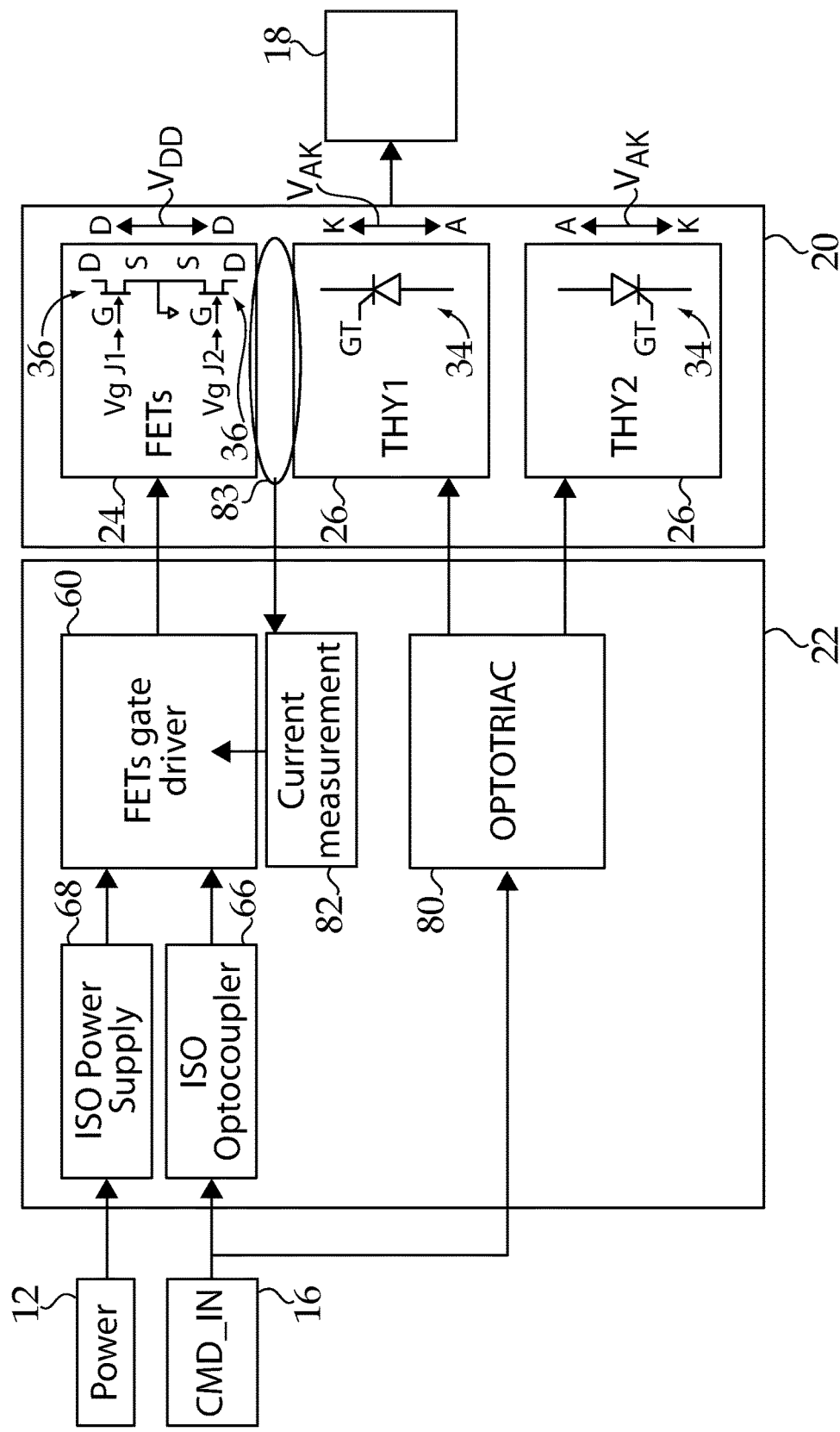
FIG. 16 schematically illustrates some aspects of a non-limiting example of a realization of a control circuit for controlling at least one FET-type device and at least one thyristor-type device in accordance with an embodiment of the present invention.
Figure 17:
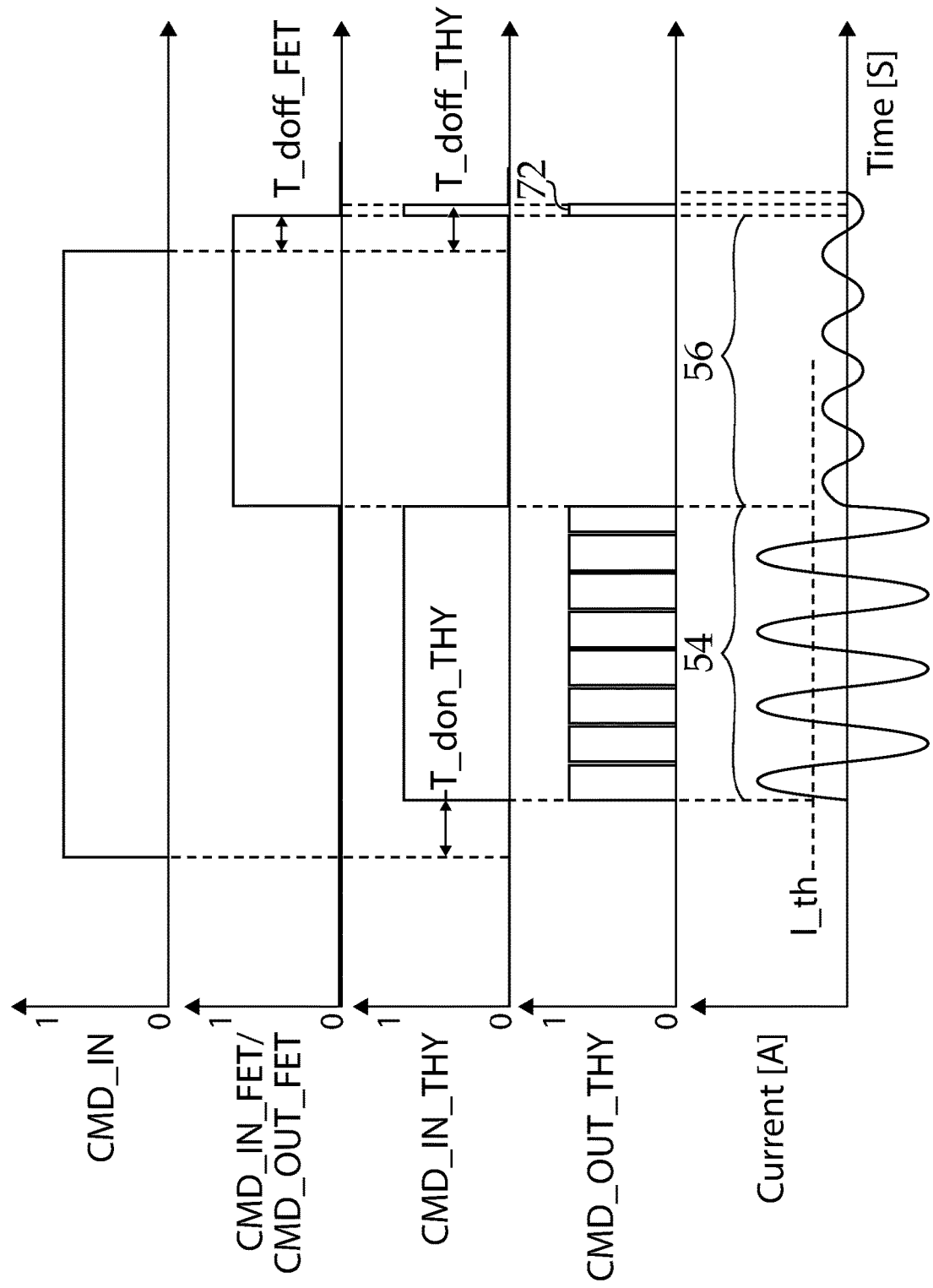
FIG. 17 schematically illustrates some aspects of a non-limiting example of logic and command/control signals for controlling at least one FET-type device and at least one thyristor-type device in accordance with an embodiment of the present invention.

Referring to FIGS. 16 and 17, some aspects of a non-limiting example of an embodiment of the present invention is illustrated. FIG. 16 schematically illustrates some aspects of a non-limiting example of a realization of a control circuit for controlling the at least one FET-type device 24 and the at least one thyristor-type device 26 in accordance with an embodiment of the present invention. Gate driver 22 of the embodiment of FIG. 16 includes a FET gate driver circuit 60 coupled to the gate(s) of the at least one FET-type device 24 (e.g., FETs 36), an optocoupler 66 coupled to command input 16 and FET gate driver circuit 60, an isolated power supply 68 coupled to power source 12 and FET gate driver circuit 60, a thyristor-type device gate driver circuit in the form of an opto triac or optotriac 80 coupled to command input 16 and the at least one thyristor-type device 26, and a current measurement circuit 82 coupled to FET gate driver circuit 60 and solid state switch 20. Optocoupler 66, and isolated power supply 68 are similar to those described above with respect to FIG. 12. Optotriac 80 is similar to that described above with respect to FIG. 15. Some embodiments may employ a single optotriac, whereas other may employ more than one optotriac, e.g., one optotriac per thyristor-type device. FET gate driver circuit 60 is similar to that described above with respect to FIG. 15, except that the at least one FET-type device 24 conducts only during nominal current, and that the at least one FET-type device 24 is activated/deactivated based on a current 83 measurement, i.e., current passing through switch 20.

The embodiment of FIG. 16 is based on optotriacs with an alternate optotriac operation scheme. The alternate conduction of the embodiment of FIG. 16 is characterized by the thyristor-type devices conducting only during the surge current, for example and without limitation, inrush and motor start current, and the FET-type devices conducting only during the nominal current. The at least one FET-type device 24 conduction is disabled during surge, forcing the full current to flow through the thyristor-type devices. A control circuit, e.g., one or more gate driver 22 circuits, enables and disables the control signal of the FET-type devices based on a current measurement, as shown in FIG. 16.

FIG. 17 schematically illustrates some aspects of a non-limiting example of logic and command/control signals for controlling the at least one FET-type device 24 and the at least one thyristor-type device 26 in accordance with an embodiment of the present invention, e.g., including the embodiment of FIG. 16. In FIG. 17, it is seen that that once the command signal (CMD_IN) goes high, the thyristor enabling signal or input command CMD_IN_THY goes high after the time delay T_don_THY. The thyristor-type device is activated when CMD_OUT_THY goes high, which in the embodiment of FIG. 17 takes place at the same time that the thyristor-type device enabling signal CMD_IN_THY goes high. During surge current 54 conditions, only the at least one thyristor-type device 26 is activated, as illustrated in FIG. 17 wherein CMD_OUT_THY is high during surge current 54, activating the at least one thyristor-type device 26, whereas the FET-type device gate drive signal CMD_IN_FET/CMD_OUT_FET is low during the surge current 54 conditions, deactivating at least one FET-type device 24. When nominal current 56 conditions are achieved, the FET-type device gate drive signal CMD_IN_FET/CMD_OUT_FET goes high, activating the at least one FET-type device 24, and simultaneously, the thyristor-type device enabling and gate drive signals, CMD_IN_THY and CMD_OUT_THY go low, deactivating the at least one thyristor-type device 26. The embodiment of FIGS. 16 and 17 thus performs atemporal sharing without concurrent sharing, wherein the at least one FET-type device conducts only during nominal current conditions, and wherein the at least one thyristor-type device 26 conducts only during surge current conditions.

When the input command (CMD_IN) goes low (CMD_IN=0), the at least one FET-type device 24 turns off after a predetermined delay (T_doff_FET in FIG. 17), and the at least one thyristor-type device is activated simultaneously with the deactivation of the at least one FET-type device 24 (CMD_IN_THY and CMD_OUT_THY=1), and then the input command for the at least one thyristor-type device 26 (CMD_IN_THY) goes low after another predetermined time delay (T_doff_THY).

Figure 18:
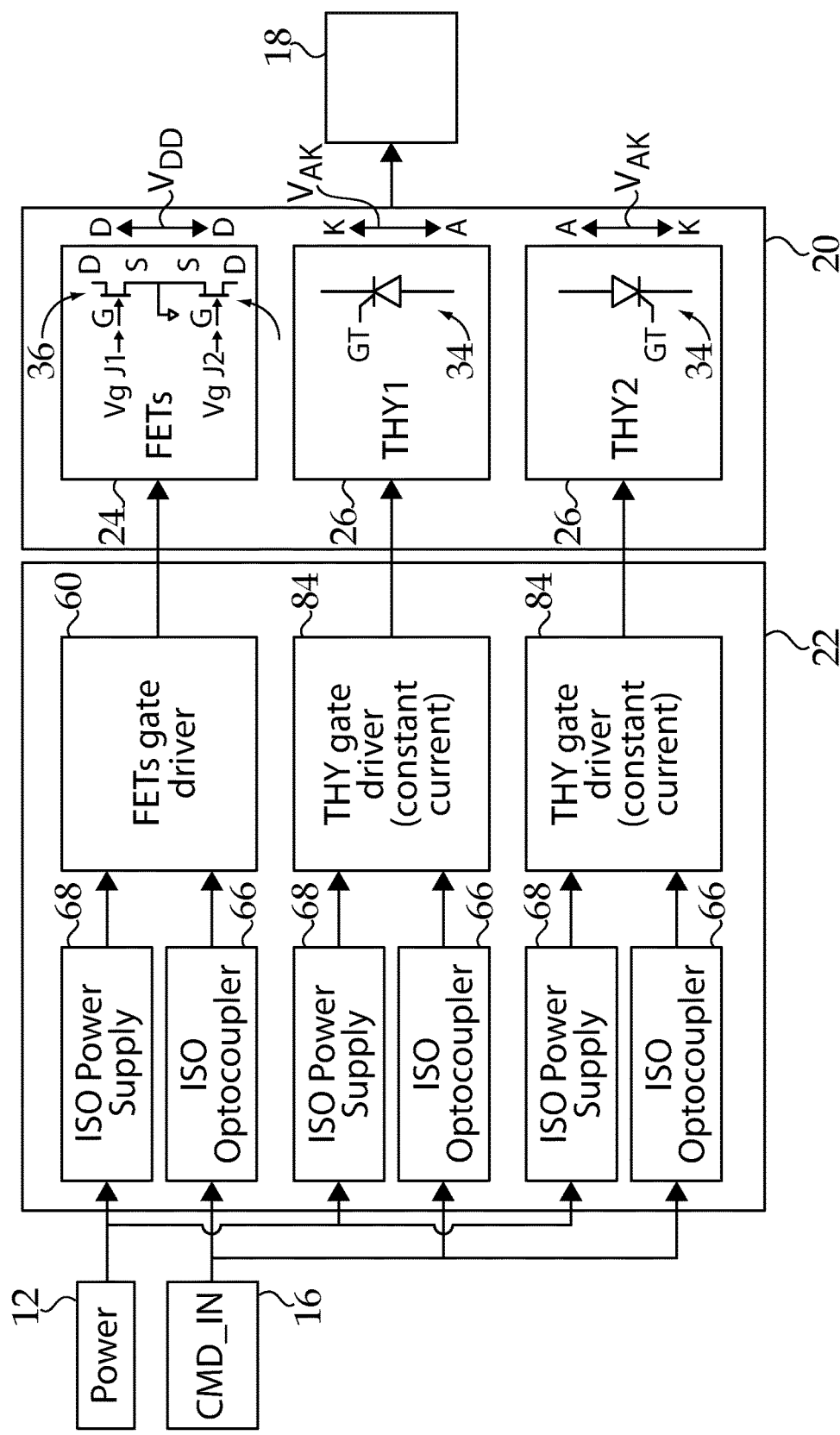
FIG. 18 schematically illustrates some aspects of a non-limiting example of a realization of a control circuit for controlling at least one FET-type device and at least one thyristor-type device in accordance with an embodiment of the present invention.

FIG. 18 schematically illustrates some aspects of a non-limiting example of a realization of a control circuit for controlling the at least one FET-type device 24 and the at least one thyristor-type device 26 in accordance with an embodiment of the present invention. Gate driver 22 of the embodiment of FIG. 18 includes a FET gate driver circuit 60 coupled to the gate(s) of the at least one FET-type device 24 (e.g., FETs 36), two thyristor gate driver circuits 84, optocouplers 66 coupled to command input 16 and to respective FET gate driver circuit 60 and thyristor gate driver circuits 84, and isolated power supplies 68 coupled to power source 12 and to each of respective FET gate driver circuit 60 and thyristor gate driver circuits 84. Each thyristor gate driver circuit 84 is coupled to a respective isolated power supply 68 and thyristor-type device 34. FET gate driver circuit 60, optocouplers 66, and isolated power supply 68 are similar to those described above with respect to FIG. 12. Gate driver circuits 84 are coupled to at least one thyristor-type device 26, e.g., to the gate GT and cathode of each thyristor 34. Gate driver circuits 84 are operative to provide gate drive signals to the gates for turning on or activating the thyristor-type devices and turning off or deactivating the thyristor-type devices for respectively connecting and disconnecting electrical device 18 from power source 12 on the thyristor-type device side of solid state switch 14.

The embodiment of FIG. 18 is based on a constant current thyristor isolated gate driver circuits 84. The isolated gate driver circuits 84 provides constant gate current to the at least one thyristor-type device 26, permitting turn-on of the thyristor-type devices whenever they are forward biased, e.g., when the voltage drop across the at least one FET-type device forward biases the thyristor-type devices and exceeds the embedded knee voltage of the thyristor-type devices. In some embodiments, the voltage drop across the at least one FET-type device may increase due to the FET-type devices being turned off in order to drive the at least one thyristor-type devices into the conducting condition. In some embodiments, the voltage drop across the at least one FET-type device may increase due to the FET-type devices operating in the high loss regime 70. This solution employs a thyristor-type device associated optocoupler 66 or other isolator, a single thyristor-type device associated isolated power supply 68, and an isolated gate driver circuit 84 for each thyristor-type device, as illustrated in FIG. 18. Other embodiments may employ a single or multiple thyristor-type device associated optocoupler 66 or other isolator, associated isolated power supply 68 and/or gate driver circuit 84. The embodiment of FIG. 18 may employ some or all aspects of the of logic and command/control signals for operating at least one FET-type device and at least one thyristor-type device illustrated in FIG. 11. In one form, the embodiment of FIG. 18 performs atemporal sharing with concurrent sharing. For example, during surge current conditions, e.g., during startup of electrical device 18 or during other operating regimes or other circumstances that yield surge currents, both the at least one FET-type device 24 and the at least one thyristor-type device 26 conduct current to electrical device 18, whereas during nominal operating conditions, only the at least one FET-type device 24 conducts current to electrical device 18. In other embodiments, concurrent sharing, atemporal sharing or combinations thereof may be utilized. In some embodiments, the at least one FET-type devices may be turned off during surge current conditions.

Figure 19:
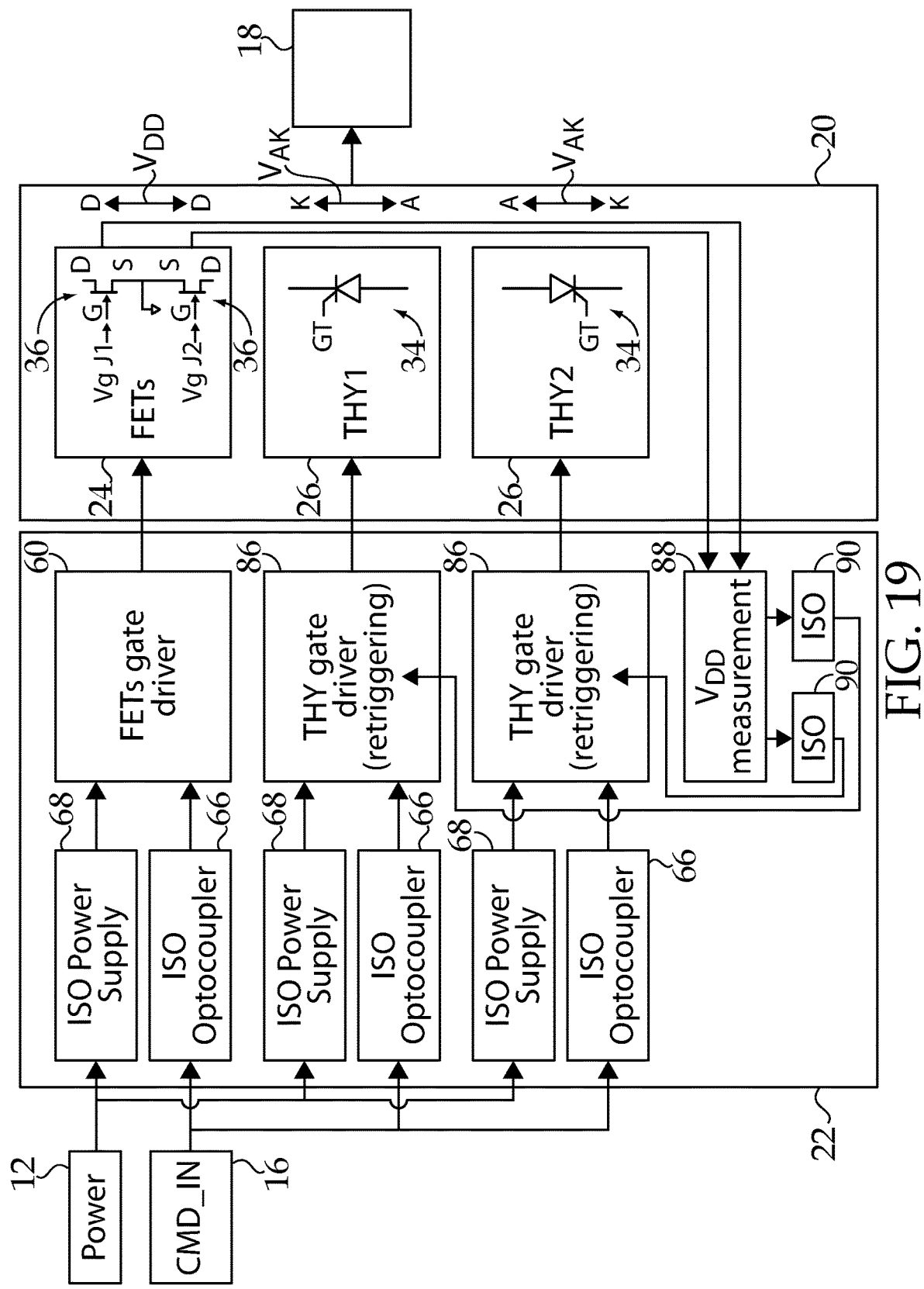
FIG. 19 schematically illustrates some aspects of a non-limiting example of a realization of a control circuit for controlling at least one FET-type device and at least one thyristor-type device in accordance with an embodiment of the present invention.
Figure 20:
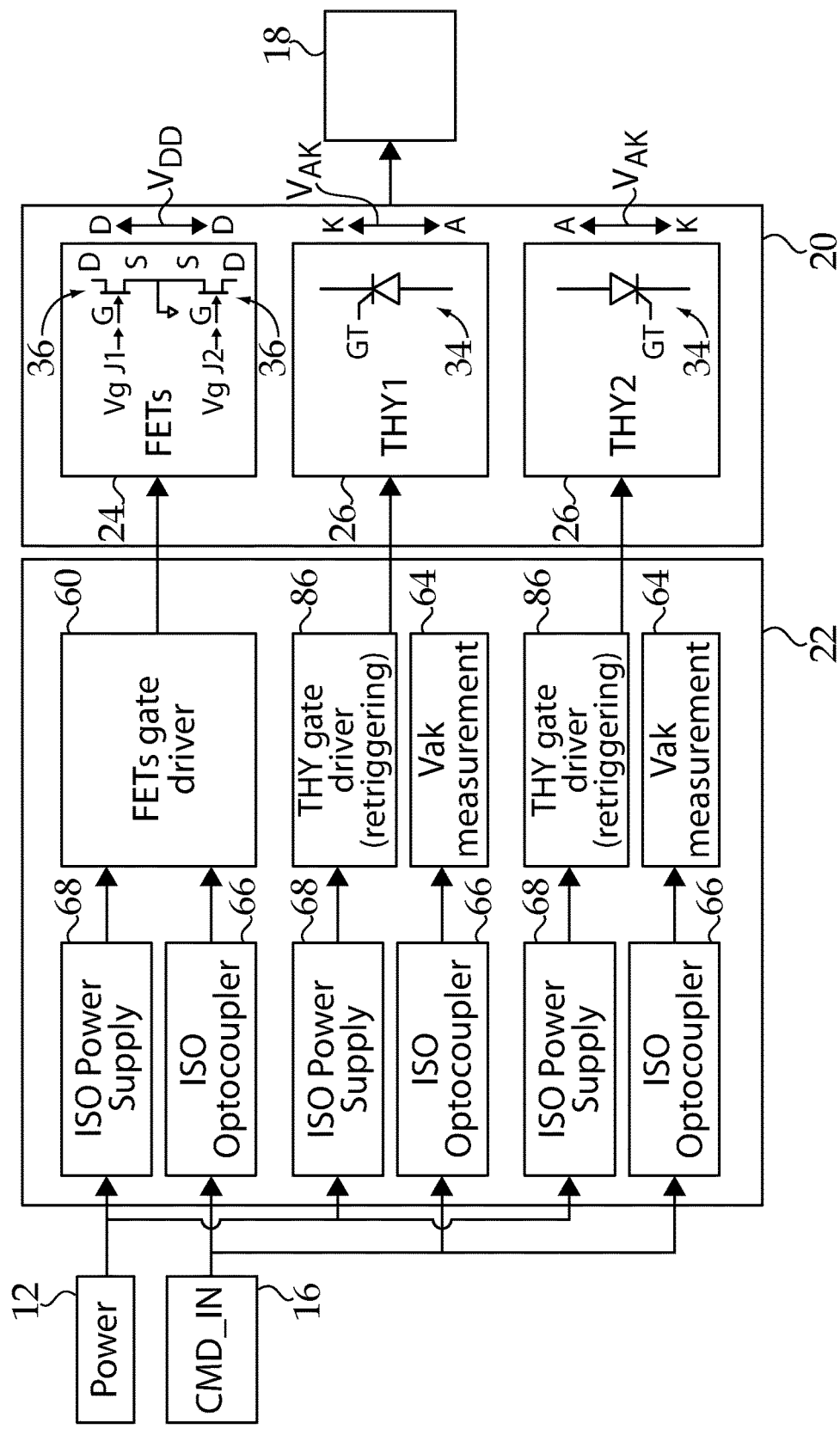
FIG. 20 schematically illustrates some aspects of a non-limiting example of a realization of a control circuit for controlling at least one FET-type device and at least one thyristor-type device in accordance with an embodiment of the present invention.

FIGS. 19 and 20 schematically illustrate some aspects of non-limiting examples of realizations of control circuits for controlling the at least one FET-type device 24 and the at least one thyristor-type device 26 in accordance with some embodiments of the present invention. In the embodiments of FIGS. 19 and 20, the control circuit employs a current pulse thyristor isolated gate driver circuit with retriggering. The isolated gate driver generates a current pulse to the gate of the at least one thyristor-type device 26 when the current in the at least one FET-type device 24 causes the thyristor voltage to go beyond a certain threshold and when the thyristor-type devices are forward biased. This control permits current sharing only when the current is beyond a predetermined threshold. This threshold can be carefully regulated, e.g., in order to manage or optimize the current sharing and manage or optimize the thermal stress among the devices. The embodiment of FIGS. 19 and 20 may employ some or all aspects of the of logic and command/control signals for operating at least one FET-type device 24 and at least one thyristor-type device 26 illustrated in FIG. 11.

Gate driver 22 of the embodiment of FIG. 19 includes a FET gate driver circuit 60 coupled to the gate(s) of the at least one FET-type device 24 (e.g., FETs 36), two thyristor gate driver circuits 86 with retriggering, optocouplers 66 coupled to command input 16 and to respective FET gate driver circuit 60 and thyristor gate driver circuits 86, and isolated power supplies 68 coupled to power source 12 and to each of respective FET gate driver circuit 60 and thyristor gate driver circuits 86. Each thyristor gate driver circuit 86 is coupled to a respective thyristor-type device 34. FET gate driver circuit 60, optocouplers 66, and isolated power supply 68 are similar to those described above with respect to FIG. 12. Gate driver 22 of the embodiment of FIG. 19 also includes a $V_{DD}$ measurement circuit 88 coupled to FETs 34, and two isolators 90 coupled to $V_{DD}$ measurement circuit 88 and respective gate drivers 86, one for each thyristor-type device, e.g., one isolator 90 for each thyristor 34. $V_{DD}$ measurement circuit 88 is operative to sense or measure the voltage $V_{DD}$ across the at least one FET-type device, e.g., across the two FETs 34, and to generate triggering signals used by thyristor gate driver circuits 86 for retriggering and activating the thyristor-type devices 34.

In the embodiment of FIG. 19, $V_{DD}$ measurement circuit 88, for the measurement of the voltage and generation of the triggering signal, can be at the same potential of the at least one FET-type device 24. The signal can then be sent to the isolated gate driver 86 of the at least one thyristor-type device 26, e.g., through an isolation circuit such as isolator 88 or an isolation transformer, as illustrated in FIG. 19. In another embodiment, the circuit for the measurement of the voltage and generation of the triggering signal can be at the potential of the isolated gate driver of the thyristor-type devices 34, e.g., using $V_{AK}$ measurement circuits 64, as described above with respect to FIG. 12, and as illustrated in the embodiment of FIG. 20. The embodiment of FIG. 20 is similar to the embodiment of FIG. 19 except that $V_{AK}$ measurement circuits 64 replace $V_{DD}$ measurement circuit 88 and isolators 90. In some embodiments, only a single gate driver circuit 86 with an associated isolated power supply

68, isolator or optocoupler 66 and $V_{DD}$ measurement circuit 88 with isolator 90 or $V_{AK}$ measurement circuit 64 may be employed. In the embodiments of FIGS. 19 and 20, the thyristor-type devices are activated when the current flowing through the FET-type devices causes a sufficient voltage drop across the FET-type devices to exceed a voltage threshold, e.g., when the FET-type devices are operating in high loss regime 70. The voltage threshold may vary with the needs of the particular application.

The embodiments of FIGS. 19 and 20 may employ some or all aspects of the of logic and command/control signals for operating the at least one FET-type device 24 and at least one thyristor-type device 26 illustrated in FIG. 11. The embodiments of FIGS. 19 and 20 perform atemporal sharing with concurrent sharing. For example, during surge current conditions, e.g., during startup of electrical device 18 or during other operating regimes or other circumstances that yield surge currents, both the at least one FET-type device 24 and the at least one thyristor-type device 26 conduct current to electrical device 18, whereas during nominal operating conditions, only the at least one FET-type device 24 conducts current to electrical device 18. In other embodiments, concurrent sharing, atemporal sharing or combinations thereof may be utilized.

Figure 21:
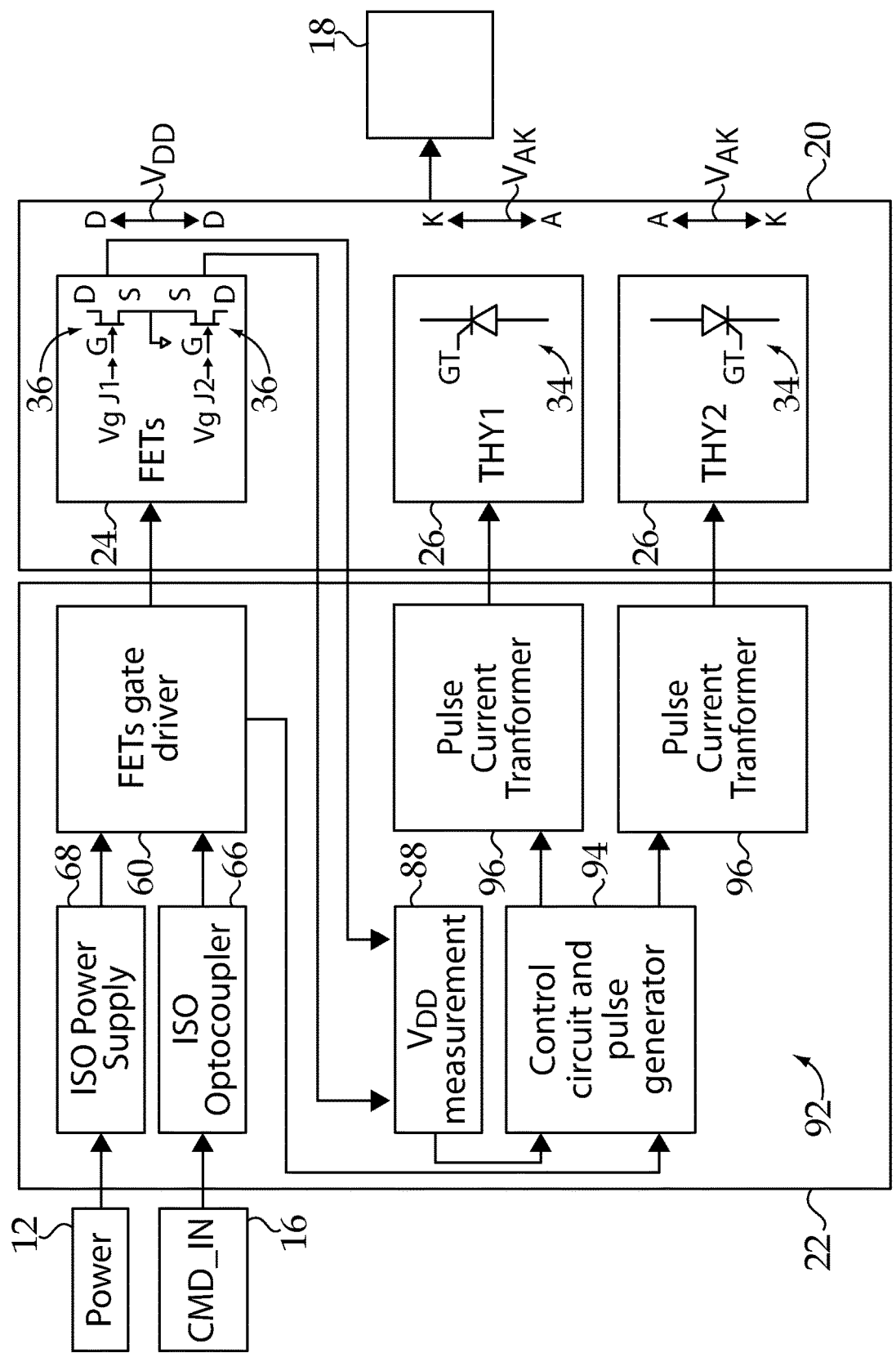
FIG. 21 schematically illustrates some aspects of a non-limiting example of a realization of a control circuit for controlling at least one FET-type device and at least one thyristor-type device in accordance with an embodiment of the present invention.

FIG. 21 schematically illustrates some aspects of a non-limiting example of a realization of control circuit for controlling the at least one FET-type device 24 and the at least one thyristor-type device 26 in accordance with an embodiment of the present invention. Gate driver 22 of the embodiment of FIG. 21 includes a FET gate driver circuit 60 coupled to the gate(s) of the at least one FET-type device 24 (e.g., FETs 36), an optocoupler 66 coupled to command input 16 and to FET gate driver circuit 60, an isolated power supply 68 coupled to power source 12 and to FET gate driver circuit 60, and a $V_{DD}$ measurement circuit 88 coupled to the at least one FET-type device, e.g., across FETs 36. FET gate driver circuit 60, optocoupler 66, and isolated power supply 68 are similar to those described above with respect to FIG. 12. $V_{DD}$ measurement circuit 88 is similar to that described above with respect to FIG. 19. Gate driver 22 of the embodiment of FIG. 21 also includes a thyristor-type device gate driver circuit 92 coupled to $V_{DD}$ measurement circuit 88. Gate driver circuit 92 includes a control circuit and pulse generator 94 coupled to $V_{DD}$ measurement circuit 88, and a pulse current transformer 96 for each thyristor-type device, each pulse current transformer 96 being coupled to control circuit and pulse generator 94 and a thyristor-type device, e.g., thyristor 34.

$V_{DD}$ measurement circuit 88 is operative to provide a triggering signal to control circuit and pulse generator 94 based on $V_{DD}$, e.g., based on $V_{DD}$ reaching or exceeding a threshold. The threshold may be, for example, an embedded knee voltage for the thyristor-type devices so that the thyristor-type devices can be turned on when forward biased and the threshold exceeded. In another example, the threshold may correspond to a voltage drop across the FET-type devices indicative of conducting current at $I_k$ or in high loss regime 70. In another embodiment, the threshold voltage may be some voltage associated with the at least one FET-type device turning off or deactivating, wherein the reaching or exceeding of the threshold is used to activate the thyristor-type devices simultaneously or substantially simultaneously with the FET-type devices being in the process of deactivating or turning off. Control circuit and pulse generator 94 is operative to generate pulses when the threshold is achieved, which are supplied to pulse current transformers 96 for supplying gate drive signals for the thyristor-type devices.

The embodiment of FIG. 21 employs thyristor-type-device gate driver with pulse transformer 92 to provide an isolated current pulse to the gate of the thyristor-type-devices. A thyristor-type-device gate driver with a pulse transformer does not require an additional isolated power supply, as the isolation is provided by the pulse transformer, as shown in FIG. 21, which may eliminate the need for one or more isolated power supplies. The embodiment of FIG. 21 may employ some or all aspects of the of logic and command/control signals for operating at least one FET-type device and at least one thyristor-type device illustrated in FIG. 11.

The embodiments of FIG. 21 thus perform atemporal sharing with or without concurrent sharing, depending upon the embodiment. For example, during surge current conditions, e.g., during startup of electrical device 18 or during other operating regimes or other circumstances that yield surge currents, in some embodiments, the at least one FET-type device 24 may be turned off, and the at least one thyristor-type device 26 is turned on simultaneously when the threshold is reached or exceeded, yielding atemporal sharing without concurrent sharing. In another embodiment, the at least one FET-type device may remain activated when a threshold indicative of $I_k$ or FET-type device conduction in high loss regime 70 or even operation below $I_k$ in low loss regime 69 is achieved, thus providing atemporal sharing with concurrent sharing, wherein both the at least one FET-type device 24 and the at least one thyristor-type device 26 conduct current to electrical device 18 during some higher current conditions, whereas during lower operating conditions, only the at least one FET-type device 24 conducts current to electrical device 18. The $V_{DD}$ comparison threshold may be used to determine the sharing, and may vary with the needs of the application. This applies to other embodiments, having atemporal sharing with or without concurrent sharing as well e.g., embodiments described herein and/or illustrated in other FIGS. or neither described herein nor illustrated in the FIGS. In various embodiments, concurrent sharing, atemporal sharing or combinations thereof may be utilized.

Figure 22:
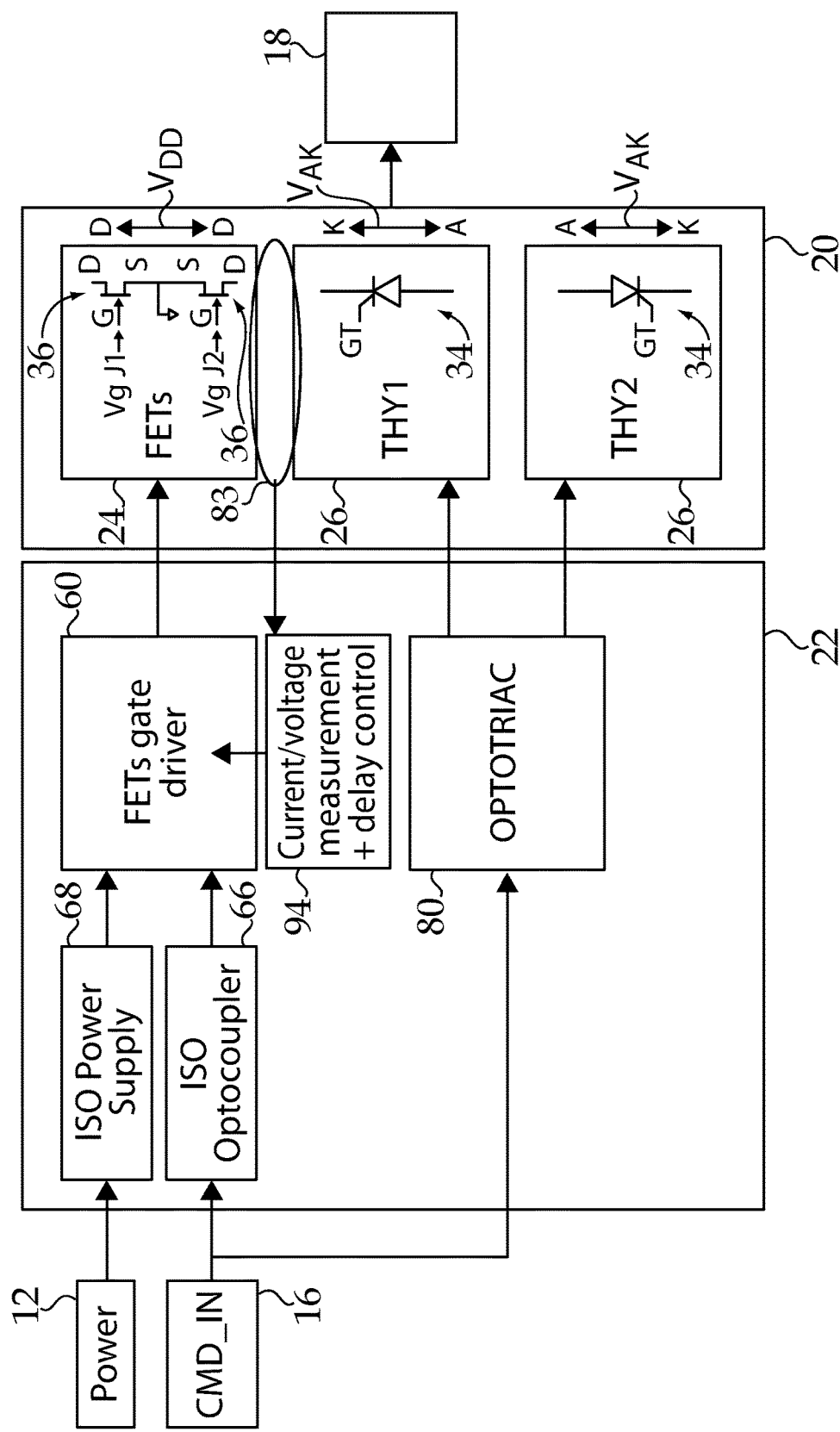
FIG. 22 schematically illustrates some aspects of a non-limiting example of a realization of a control circuit for controlling at least one FET-type device and at least one thyristor-type device in accordance with an embodiment of the present invention.
Figure 23:
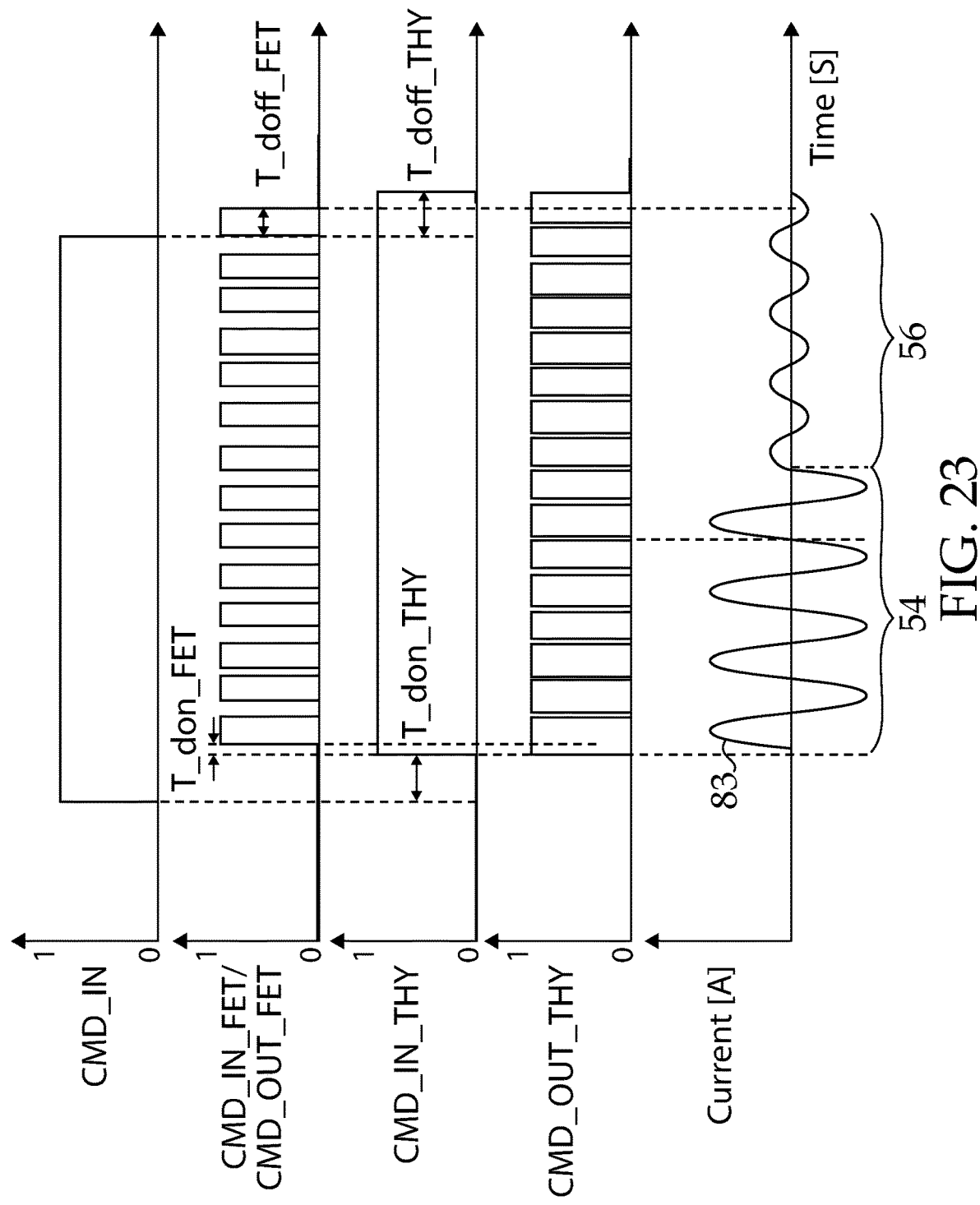
FIG. 23 schematically illustrates some aspects of a non-limiting example of logic and command/control signals for operating at least one FET-type device and at least one thyristor-type device in accordance with an embodiment of the present invention.

FIG. 22 schematically illustrates some aspects of a non-limiting example of a realization of control circuit for controlling the at least one FET-type device 24 and the at least one thyristor-type device 26 in accordance with an embodiment of the present invention. FIG. 23 schematically illustrates some aspects of a non-limiting example of logic and command/control signals for operating the at least one FET-type device 24 and the at least one thyristor-type device 26 in accordance with an embodiment of the present invention.

Gate driver 22 of the embodiment of FIG. 22 includes a FET gate driver circuit 60 coupled to the gate(s) of the at least one FET-type device 24 (e.g., FETs 36), an optocoupler 66 coupled to command input 16 and FET gate driver circuit 60, an isolated power supply 68 coupled to FET gate driver circuit 60, a thyristor-type device gate drive circuit in the form of an optotriac 80 coupled to the at least one thyristor-type device 26 and to command input 16, and a current/voltage measurement circuit 94 coupled to FET gate driver circuit 60 and solid state switch 20. Optocoupler 66 and isolated power supply 68 are similar to those described above with respect to FIG. 12. Optotriac 80 is similar to that described above with respect to FIG. 15. Some embodiments may employ a single optotriac, whereas other may employ more than one optotriac, e.g., one optotriac per thyristor-type device. FET gate driver circuit 60 is similar to that described above with respect to FIG. 15, except that the at least one FET-type device 24 is activated/deactivated based on a current 83 measurement, i.e., current passing through switch 20, sensed by current/voltage measurement circuit 94; except that the FET-type device gate drive signals are pulsed signals; and except that the FET-type device gate drive signal pulses are delayed. For example, the embodiment of FIG. 22 employs optotriac thyristor gate driver circuit 80 with delayed control of the FET-type devices.

The optotriac 80 uses the voltage across the thyristor-type devices to power the gate current pulse to latch both thyristor-type devices. The control circuit for the FET-type devices, e.g., current/voltage measurement circuit 94, senses the zero crossing and generates a delayed pulse, sent to FET gate driver circuit 60 to activate the FETs after the thyristors are already conducting. Furthermore, a turn-off signal is generated before zero crossing to enable retriggering of the thyristors conducting in the following semi-cycle. This function can be realized with a control circuit based on current or voltage measurement, as shown in the logic and control signals illustrated in FIG. 23.

As with the other illustrated embodiments, The FET-type device gate drive signals and the thyristor-type device gate drive signals are delayed from the start of the input command signal going high (CMD_IN=1). The FET-type device delay is given by T_don_FET in FIG. 23, whereas the thyristor-type device delay is given by T_don_THY. Nomenclature employed in FIG. 23 is similar to that employed in FIG. 11, wherein CMD_IN_FET/CMD_OUT_FET is the FET-type gate drive signal, CMD_IN_THY is the thyristor-type device enable signal, and CMD_OUT_THY is the thyristor-type device gate drive signal. In the embodiment of FIGS. 22 and 23, both the at least one FET-type device 24 and the at least one thyristor-type device 26 conduct during both surge current conditions 54 ad nominal current conditions 56 of the current 83 conducted by switch 20 to electrical device 18. The FET-type device on delay is greater than the thyristor-type device on delay, illustrating that the thyristor-type devices are turned on prior to the FET-type devices. When it is desired to disconnect electrical device 18 from power source 12, the command input signal goes low (CMD_IN=0), after which deactivation of the FET-type device gate drive is performed subsequent to a delay T_doff_FET, and deactivation of the thyristor-type device is performed subsequent to a delay T_doff_THY. T_doff_THY is greater than T_doff_FET, and thus the FET-type device is deactivated while the thyristor-type device is still conducting, as mentioned hereinabove. The embodiment of FIGS. 22 and 23 perform concurrent sharing, as is illustrated in FIG. 23 by both the FET-type devices and the thyristor-type devices both conducting during both surge current conditions 54 ad nominal current conditions 56. In various embodiments, concurrent sharing, atemporal sharing or combinations thereof may be utilized.

Embodiments of the present invention include a solid state switch system for connecting and disconnecting an electrical device to/from a power source, comprising: a first terminal constructed for coupling to and receiving power from a power source; a second terminal constructed for delivering power from the power source to the electrical device; at least one FET-type device coupled to the first terminal and the second terminal; at least one thyristor-type device coupled to the first terminal and the second terminal in parallel to the at least one FET-type device; and a gate driver operative to send gate drive signals to the at least one FET-type device and to the at least one thyristor-type device for providing current to the electrical device; wherein the gate driver is constructed to control a split of the current as between the at least one FET-type device and the at least one thyristor-type device.

In a refinement, the split depends upon a magnitude of the current.

In another refinement, the gate driver is constructed to provide a first set of gate drive signals to the at least one FET-type device and to the at least one thyristor-type device under nominal current conditions; wherein the gate driver is constructed to provide a second set of gate drive signals to the at least one FET-type device and to the at least one thyristor-type device under surge current conditions; and wherein the second set of gate drive signals is different than the first set of gate drive signals.

In yet another refinement, the electrical device has a rated current, wherein the nominal current conditions are a current flow at approximately the rated current or less.

In still another refinement, the first set of gate drive signals is operative to direct the current through each of the at least one FET-type device and the at least one thyristor-type device during the nominal current conditions.

In yet still another refinement, the first set of gate drive signals is operative to direct the current through only the at least one FET-type device during the nominal current conditions.

In a further refinement, the second set of gate drive signals is operative to direct the current through each of the at least one FET-type device and the at least one thyristor-type device during the surge current conditions.

In a yet further refinement, the second set of gate drive signals is operative to the direct the current through only the at least one thyristor-type device during the surge current conditions.

In a still further refinement, the gate driver is operative to receive a command signal to supply current to the electrical device; wherein the gate driver is constructed to delay a control signal to turn on the at least one FET-type device by a first time delay from the start of the command signal; and wherein the gate driver is constructed to delay a control signal to turn on the at least one thyristor-type device by a second time delay from the start of the command signal.

In a yet still further refinement, the first time delay and the second time delay are configured to direct the at least one FET-type device and the at least one thyristor-type device to turn on simultaneously.

In another further refinement, the second time delay is greater than the first time delay.

In yet another further refinement, the first time delay is greater than the second time delay.

In still another further refinement, the gate driver is operative to receive a command signal to supply the current to the electrical device; wherein the gate driver is constructed to delay a control signal to turn off the at least one FET-type device by a first time delay from the end of the command signal; and wherein the gate driver is constructed to delay a control signal to turn off the at least one thyristor-type device by a second time delay from the end of the command signal.

In yet still another further refinement, the second time delay is greater than the first time delay.

In an additional refinement, the first time delay is greater than the second time delay.

In another additional refinement, the gate driver is constructed to turn on the at least one thyristor-type device simultaneously with turning off the at least one FET-type device in response to the end of the command signal.

In yet another additional refinement, the gate driver is operative to receive a command to stop supplying the current to the electrical device; wherein the gate driver is constructed to turn off the at least one FET-type device in response to the command while the at least one thyristor-type device is still turned on.

In still another additional refinement, the gate driver is operative to receive a command to stop supplying current to the electrical device; wherein the gate driver is constructed to simultaneously turn off the at least one FET-type device and turn on the at least one thyristor-type device in response to the command.

In yet still another additional refinement, the at least one FET-type device has a first power loss profile based on the rated current associated with the electrical device; the at least one thyristor-type device has a second power loss profile based on an inrush current and a start current associated with the electrical device; and the gate driver is constructed to control a split of the current based on a threshold determined via a correlation between the first power loss profile and the second power loss profile.

Embodiments of the present invention include a solid state switch system for connecting and disconnecting an electrical device to/from a power source, comprising: a command input operative to provide a command signal for commanding connection or disconnection of the electrical device; at least one FET-type device coupled to the electrical device and the power source; at least one thyristor-type device coupled to the electrical device and the power source in parallel to the at least one FET-type device; a first gate driver circuit coupled to the at least one FET-type device and operative to provide a first gate drive signal to the at least one FET-type device, wherein the first gate drive signal is a continuous signal; a second gate driver circuit coupled to the at least one thyristor-type device and operative to provide a second gate drive signal to the at least one thyristor-type device; and an isolated power supply coupled to the first gate driver circuit and operative to supply power to the first gate driver circuit for generating the first gate drive signal.

In a refinement, the solid state switch system further comprises another isolated power supply coupled to the second gate driver circuit and operative to supply power to the second gate driver circuit for generating the second gate drive signal.

In another refinement, the second gate driver circuit is constructed to provide a pulsed gate drive signal to the at least one thyristor-type device.

In yet another refinement, the second gate driver circuit is constructed to provide a constant gate drive signal to the at least one thyristor-type device.

In still another refinement, the solid state switch system further comprises an isolator coupled to the command input and the first gate driver circuit, and operative to provide an isolated command signal to the first gate driver circuit.

In yet still another refinement, the isolator is an optocoupler.

In a further refinement, the solid state switch system further comprises an isolator coupled to the command input and operative to provide an isolated command signal for generating the second gate drive signal.

In a yet further refinement, the solid state switch system further comprises a voltage $V_{AK}$ measurement circuit operative to compare a voltage $V_{AK}$ across the at least one thyristor-type device with a threshold voltage, wherein the second gate driver circuit is operative to send a gate drive signal to the at least one thyristor-type device when the voltage $V_{AK}$ exceeds the threshold voltage and when the command signal is high.

In a still further refinement, the first gate driver circuit is operative to provide the first gate drive signal to the at least one FET-type device after a first time delay measured from when the command signal becomes high; and the second gate driver circuit is operative to provide the second gate drive signal to the at least one thyristor-type device after a second time delay measured from when the command signal becomes high, wherein the first time delay and the second time delay are configured to achieve simultaneous turn-on of the at least one FET-type device and the at least one thyristor-type device after the command signal becomes high.

In a yet still further refinement, the first gate driver circuit is operative to deactivate the at least one FET-type device after a third time delay measured from when the command signal becomes low; the second gate driver circuit is operative to activate the at least one thyristor-type device simultaneous with the at least one FET-type device being deactivated; and the second gate driver circuit is operative to subsequently provide, after a fourth time delay measured from when the command signal becomes low, a gate drive signal operative to allow the at least one thyristor-type device to turn off naturally at zero crossing.

In another further refinement, the second gate driver circuit includes an optotriac coupled to the command input and to the at least one thyristor-type device, wherein the optotriac is operative to generate the second gate drive signal from a voltage build-up across the at least one thyristor-type device.

In yet another further refinement, the solid state switch system further comprises a current measurement circuit coupled to the first gate driver circuit, wherein the first gate driver circuit is constructed to disable the at least one FET-type device during a surge current based on the output of the current measurement circuit.

In still another further refinement, the solid state switch system further comprises a voltage measurement circuit operative to measure a voltage across the at least one FET-type device; and an isolator coupled to the voltage measurement circuit and to the at least one thyristor-type device, wherein the second gate driver circuit is configured to turn on the at least one thyristor-type device only when the voltage across the at least one FET-type device exceeds a threshold voltage.

In yet still another further refinement, the solid state switch system further comprises a voltage measurement circuit operative to measure a voltage across the at least one thyristor-type device; and an isolator coupled to the voltage measurement circuit and to the at least one thyristor-type device, wherein the second gate driver circuit is configured to turn on the at least one thyristor-type device only when the voltage across the at least one thyristor-type device exceeds a threshold voltage.

In an additional refinement, the solid state switch system further comprises a voltage measurement circuit operative to measure a voltage across the at least one FET-type device, wherein the second gate driver circuit includes a pulse generator coupled to the voltage measurement circuit; and a pulse current transformer coupled to the pulse generator, wherein the second gate driver circuit is configured to turn on the at least one thyristor-type device only when the voltage across the at least one thyristor-type device exceeds a threshold voltage.

In another additional refinement, the first gate driver circuit includes a measurement and delay circuit operative to sense a zero crossing and generate a delayed first gate drive signal pulse to activate the at least one FET-type device after the at least one thyristor-type device is already conducting, and to deactivate the at least one FET-type device before the zero crossing.

Embodiments of the present invention include a method of operating a solid state switch to connect and disconnect an electrical device to/from a power source, comprising: receiving a command signal; and connecting the electrical device to the power source by activating at least one FET-type device after a first time delay subsequent to the command signal becoming high; and activating at least one thyristor-type device after a second time delay subsequent to the command signal becoming high.

In a refinement, the first time delay and the second time delay are configured to achieve simultaneous turn-on of the at least one FET-type device and the at least one thyristor-type device.

In another refinement, the method further comprises disconnecting the electrical device from the power source by deactivating the at least one FET-type device after a third time delay subsequent to the command signal becoming low; and activating the at least one thyristor-type device simultaneous with deactivating the at least one FET-type device.

In yet another refinement, the method further comprises providing a gate drive signal configured to allow the at least one thyristor-type device to turn off naturally at zero crossing after a fourth delay greater than the third delay.

Embodiments of the present invention include a solid state switch system for connecting and disconnecting an electrical device to/from a power source, comprising: at least one FET-type device coupled to the electrical device; at least one thyristor-type device coupled to the electrical device and the power source in parallel to the at least one FET-type device; and means for controlling the at least one FET-type device and the at least one thyristor-type device to selectively perform current sharing.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A solid state switch system for connecting and disconnecting an electrical device to/from a power source, comprising:
   a first terminal constructed for coupling to and receiving power from a power source;
   a second terminal constructed for delivering power from the power source to the electrical device;
   at least one FET-type device coupled to the first terminal and the second terminal;
   at least one thyristor-type device coupled to the first terminal and the second terminal in parallel to the at least one FET-type device; and
   a gate driver operative to send gate drive signals to the at least one FET-type device and to the at least one thyristor-type device for providing current to the electrical device; wherein the gate driver is constructed to control a split of the current as between the at least one FET-type device and the at least one thyristor-type device,
   wherein the gate driver is operative to receive a command signal to supply current to the electrical device, and
   wherein the gate driver is constructed to either:
   (1) delay a control signal to turn on the at least one FET-type device by a first time delay from the start of the command signal and wherein the gate driver is constructed to delay a control signal to turn on the at least one thyristor-type device by a second time delay from the start of the command signal, or
   (2) delay a control signal to turn off the at least one FET-type device by a third time delay from the end of the command signal, and wherein the gate driver is constructed to delay a control signal to turn off the at least one thyristor-type device by a fourth time delay from the end of the command signal.

2. The solid state switch system of claim 1, wherein the split depends upon a magnitude of the current.

3. The solid state switch system of claim 1, wherein the gate driver is constructed to provide a first set of gate drive signals to the at least one FET-type device and to the at least one thyristor-type device under nominal current conditions; wherein the gate driver is constructed to provide a second set of gate drive signals to the at least one FET-type device and to the at least one thyristor-type device under surge current conditions; and wherein the second set of gate drive signals is different than the first set of gate drive signals.

4. The solid state switch system of claim 3, the electrical device having a rated current, wherein the nominal current conditions are a current flow at approximately the rated current or less.

5. The solid state switch system of claim 3, wherein the first set of gate drive signals is operative to direct the current through each of the at least one FET-type device and the at least one thyristor-type device during the nominal current conditions.

6. The solid state switch system of claim 3, wherein the first set of gate drive signals is operative to direct the current through only the at least one FET-type device during the nominal current conditions.

7. The solid state switch system of claim 3, wherein the second set of gate drive signals is operative to direct the current through each of the at least one FET-type device and the at least one thyristor-type device during the surge current conditions.

8. The solid state switch system of claim 3, wherein the second set of gate drive signals is operative to the direct the current through only the at least one thyristor-type device during the surge current conditions.

9. The solid state switch system of claim 1, wherein the first time delay and the second time delay are configured to direct the at least one FET-type device and the at least one thyristor-type device to turn on simultaneously.

10. The solid state switch system of claim 1, wherein the second time delay is greater than the first time delay.

11. The solid state switch system of claim 1, wherein the first time delay is greater than the second time delay.

12. The solid state switch system of claim 1, wherein the fourth time delay is greater than the third time delay.

13. The solid state switch system of claim 1, wherein the third time delay is greater than the second time delay.

14. The solid state switch system of claim 1, wherein the gate driver is constructed to turn on the at least one thyristor-type device simultaneously with turning off the at least one FET-type device in response to the end of the command signal.

15. A solid state switch system for connecting and disconnecting an electrical device to/from a power source, comprising:
a first terminal constructed for coupling to and receiving power from a power source;
a second terminal constructed for delivering power from the power source to the electrical device;
at least one FET-type device coupled to the first terminal and the second terminal;
at least one thyristor-type device coupled to the first terminal and the second terminal in parallel to the at least one FET-type device; and
a gate driver operative to send gate drive signals to the at least one FET-type device and to the at least one thyristor-type device for providing current to the electrical device; wherein the gate driver is constructed to control a split of the current as between the at least one FET-type device and the at least one thyristor-type device,
wherein the gate driver is operative to receive a command to stop supplying the current to the electrical device; and wherein the gate driver is constructed to:
(1) turn off the at least one FET-type device in response to the command while the at least one thyristor-type device is still turned on, or
(2) simultaneously turn off the at least one FET-type device and turn on the at least one thyristor-type device in response to the command.

16. A solid state switch system for connecting and disconnecting an electrical device to/from a power source, comprising:
a first terminal constructed for coupling to and receiving power from a power source;
a second terminal constructed for delivering power from the power source to the electrical device;
at least one FET-type device coupled to the first terminal and the second terminal;
at least one thyristor-type device coupled to the first terminal and the second terminal in parallel to the at least one FET-type device; and
a gate driver operative to send gate drive signals to the at least one FET-type device and to the at least one thyristor-type device for providing current to the electrical device; wherein the gate driver is constructed to control a split of the current as between the at least one FET-type device and the at least one thyristor-type device,
wherein the at least one FET-type device has a first power loss profile based on the rated current associated with the electrical device; wherein the at least one thyristor-type device has a second power loss profile based on an inrush current and a start current associated with the electrical device; and wherein the gate driver is constructed to control a split of the current based on a threshold determined via a correlation between the first power loss profile and the second power loss profile.

17. A solid state switch system for connecting and disconnecting an electrical device to/from a power source, comprising:
a command input operative to provide a command signal for commanding connection or disconnection of the electrical device;
at least one FET-type device coupled to the electrical device and the power source;
at least one thyristor-type device coupled to the electrical device and the power source in parallel to the at least one FET-type device;
a first gate driver circuit coupled to the at least one FET-type device and operative to provide a first gate drive signal to the at least one FET-type device, wherein the first gate drive signal is a continuous signal;
a second gate driver circuit coupled to the at least one thyristor-type device and operative to provide a second gate drive signal to the at least one thyristor-type device; and
an isolated power supply coupled to the first gate driver circuit and operative to supply power to the first gate driver circuit for generating the first gate drive signal.

18. The solid state switch system of claim 17, further comprising another isolated power supply coupled to the second gate driver circuit and operative to supply power to the second gate driver circuit for generating the second gate drive signal.

19. The solid state switch system of claim 18, wherein the second gate driver circuit is constructed to provide a pulsed gate drive signal to the at least one thyristor-type device.

20. The solid state switch system of claim 18, wherein the second gate driver circuit is constructed to provide a constant gate drive signal to the at least one thyristor-type device.

21. The solid state switch system of claim 17, further comprising an isolator coupled to the command input and the first gate driver circuit, and operative to provide an isolated command signal to the first gate driver circuit.

22. The solid state switch system of claim 21, wherein the isolator is an optocoupler.

23. The solid state switch system of claim 17, further comprising an isolator coupled to the command input and operative to provide an isolated command signal for generating the second gate drive signal.

24. The solid state switch system of claim 17, further comprising a voltage VAX measurement circuit operative to compare a voltage VAX across the at least one thyristor-type device with a threshold voltage, wherein the second gate driver circuit is operative to send a gate drive signal to the at least one thyristor-type device when the voltage VAX exceeds the threshold voltage and when the command signal is high.

25. The solid state switch system of claim 17, wherein the first gate driver circuit is operative to provide the first gate drive signal to the at least one FET-type device after a first time delay measured from when the command signal becomes high; and wherein the second gate driver circuit is operative to provide the second gate drive signal to the at least one thyristor-type device after a second time delay measured from when the command signal becomes high, wherein the first time delay and the second time delay are configured to achieve simultaneous turn-on of the at least one FET-type device and the at least one thyristor-type device after the command signal becomes high.

26. The solid state switch system of claim 17, wherein the first gate driver circuit is operative to deactivate the at least one FET-type device after a third time delay measured from when the command signal becomes low; wherein the second gate driver circuit is operative to activate the at least one thyristor-type device simultaneous with the at least one FET-type device being deactivated; and wherein the second gate driver circuit is operative to subsequently provide, after a fourth time delay measured from when the command signal becomes low, a gate drive signal operative to allow the at least one thyristor-type device to turn off naturally at zero crossing.

27. The solid state switch system of claim 17, wherein the second gate driver circuit includes an optotriac coupled to the command input and to the at least one thyristor-type device, wherein the optotriac is operative to generate the second gate drive signal from a voltage build-up across the at least one thyristor-type device.

28. The solid state switch system of claim 27, further comprising a current measurement circuit coupled to the first gate driver circuit, wherein the first gate driver circuit is constructed to disable the at least one FET-type device during a surge current based on the output of the current measurement circuit.

29. The solid state switch system of claim 17, further comprising:
a voltage measurement circuit operative to measure a voltage across the at least one FET-type device; and
an isolator coupled to the voltage measurement circuit and to the at least one thyristor-type device,
wherein the second gate driver circuit is configured to turn on the at least one thyristor-type device only when the voltage across the at least one FET-type device exceeds a threshold voltage.

30. The solid state switch system of claim 17, further comprising:
a voltage measurement circuit operative to measure a voltage across the at least one thyristor-type device; and
an isolator coupled to the voltage measurement circuit and to the at least one thyristor-type device,
wherein the second gate driver circuit is configured to turn on the at least one thyristor-type device only when the voltage across the at least one thyristor-type device exceeds a threshold voltage.

31. The solid state switch system of claim 17, further comprising: a voltage measurement circuit operative to measure a voltage across the at least one FET-type device, wherein the second gate driver circuit includes a pulse generator coupled to the voltage measurement circuit; and a pulse current transformer coupled to the pulse generator, wherein the second gate driver circuit is configured to turn on the at least one thyristor-type device only when the voltage across the at least one thyristor-type device exceeds a threshold voltage.

32. The solid state switch system of claim 17, wherein the first gate driver circuit includes a measurement and delay circuit operative to sense a zero crossing and generate a delayed first gate drive signal pulse to activate the at least one FET-type device after the at least one thyristor-type device is already conducting, and to deactivate the at least one FET-type device before the zero crossing.

33. A method of operating a solid state switch to connect and disconnect an electrical device to/from a power source, comprising:
receiving a command signal;
connecting the electrical device to the power source by activating at least one FET-type device after a first time delay subsequent to the command signal becoming high;
activating at least one thyristor-type device after a second time delay subsequent to the command signal becoming high;
disconnecting the electrical device from the power source by deactivating the at least one FET-type device after a third time delay subsequent to the command signal becoming low; and
activating the at least one thyristor-type device simultaneous with deactivating the at least one FET-type device.

34. The method of claim 33, wherein the first time delay and the second time delay are configured to achieve simultaneous turn-on of the at least one FET-type device and the at least one thyristor-type device.

35. The method of claim 33, further comprising: providing a gate drive signal configured to allow the at least one thyristor-type device to turn off naturally at zero crossing after a fourth delay greater than the third delay.

* * * * *